United States Patent
Ryan et al.

(10) Patent No.: US 9,569,120 B2
(45) Date of Patent: Feb. 14, 2017

(54) ADAPTIVE FLASH TUNING

(71) Applicant: Conor Maurice Ryan, Limerick (IE)

(72) Inventors: Conor Maurice Ryan, Limerick (IE); Joseph Sullivan, Shannon (IE)

(73) Assignee: NVMDURANCE LIMITED, Limerick (GB)

( * ) Notice: Subject to any disclaimer, the term of this patent is extended or adjusted under 35 U.S.C. 154(b) by 0 days.

(21) Appl. No.: 14/816,986

(22) Filed: Aug. 3, 2015

(65) Prior Publication Data

US 2016/0034206 A1 Feb. 4, 2016

Related U.S. Application Data

(60) Provisional application No. 62/033,077, filed on Aug. 4, 2014, provisional application No. 62/119,413, filed on Feb. 23, 2015.

(51) Int. Cl.
| | |
|---|---|
| G06F 12/00 | (2006.01) |
| G06F 3/06 | (2006.01) |
| G11C 16/34 | (2006.01) |
| G11C 29/50 | (2006.01) |
| G06F 12/02 | (2006.01) |

(52) U.S. Cl.
CPC .......... G06F 3/0616 (2013.01); G06F 3/0605 (2013.01); G06F 3/0634 (2013.01); G06F 3/0653 (2013.01); G06F 3/0679 (2013.01); G06F 3/0688 (2013.01); G11C 16/349 (2013.01); G11C 29/50012 (2013.01); G06F 12/0246 (2013.01)

(58) Field of Classification Search
None
See application file for complete search history.

(56) References Cited

U.S. PATENT DOCUMENTS

| | | | | |
|---|---|---|---|---|
| 8,984,214 B2* | 3/2015 | Chen | ...... | G11C 16/349 711/103 |
| 9,003,102 B2* | 4/2015 | Lassa | ...... | G06F 3/061 711/103 |
| 2010/0082884 A1* | 4/2010 | Chen | ...... | G11C 16/349 711/103 |

* cited by examiner

*Primary Examiner* — Brian Peugh
(74) *Attorney, Agent, or Firm* — Michael K. Bosworth; IPxLaw Group LLP

(57) ABSTRACT

The present invention includes embodiments of systems and methods for increasing the operational efficiency and extending the estimated operational lifetime of a flash memory storage device (and its component flash memory chips, LUNs and blocks of flash memory) by monitoring the health of the device and its components and, in response, adaptively tuning the operating parameters of flash memory chips during their operational lifetime, as well as employing other less extreme preventive measures in the interim, via an interface that avoids the need for direct access to the test modes of the flash memory chips. In an offline characterization phase, "test chips" from a batch of recently manufactured flash memory chips are used to simulate various usage scenarios and measure the performance effects of writing and attempting to recover (read) test patterns written with different sets of operating parameters over time (simulating desired retention periods).

14 Claims, 8 Drawing Sheets

ADAPTIVE FLASH TUNING

CROSS REFERENCE TO RELATED APPLICATIONS

This application claims the benefit, pursuant to 35 U.S.C. §119(e), of U.S. Provisional Patent Application No. 62/033,077, filed Aug. 4, 2014, entitled "Adaptive Parameter Tuning," and U.S. Provisional Patent Application No. 62/119,413, filed Feb. 23, 2015, entitled "Abstract Flash Trimming," each of which is hereby incorporated by reference in its entirety.

BACKGROUND

Field of Art

The present invention relates generally to increasing the operational efficiency and extending the estimated operational lifetime of flash memory devices, and in particular to doing so by adaptively tuning operating parameters of flash memory chips and employing other less extreme preventive measures in the interim, via an interface that avoids the need for direct access to the test modes of the chips.

Description of Related Art

Computer systems have increasingly come to rely upon solid-state drives (SSDs) to replace or at least supplement hard-disk drives (HDDs) as key storage system components. Despite their higher cost (which continues to drop) and lower storage capacity (which continues to increase), SSDs currently offer a variety of advantages over HDDs, including lower power requirements, faster access times and greater shock resistance, among others.

Most SSDs rely upon persistent (non-volatile) NAND-based flash memory, which employs floating-gate MOSFET (FGMOS) transistors to represent binary "0" and "1" values. Newer flash memory technologies (e.g., "MLC" or multi-level cell, and "TLC" or triple-level cell) enable storage of more than one bit per transistor cell. Alternative flash-based technologies, such as NOR-based flash memory, are also employed on occasion for specific applications, such as code execution, due to its faster read speeds.

In any event, a flash memory device, such as an SSD, typically includes a flash memory controller (or flash controller) and one or more flash memory chips. A "host" system (e.g., a laptop or desktop PC, or an enterprise server) may employ one or more internal and/or external SSDs for persistent storage. To access that storage, a host system sends "system memory commands" to an SSD, requesting that the contents of a particular file be read, written or "deleted" (i.e., "freeing up" the area of memory it occupied for future use by other files). SSDs implement those system memory commands via their flash controller, which associates a file with the particular flash memory chips and areas of flash memory in which that file is or will be stored, and ultimately sends many lower-level "controller memory commands" to one or more flash memory chips in the SSD.

It should be noted that certain characteristics of flash memory affect the nature of these controller memory commands. For example, NAND-based flash memory can effectively change a "1" value to a "0" value, but not vice-versa. Thus, while even a single byte or word of data could be read from flash memory, a write operation could not overwrite currently stored data, because the new data might require that a "0" bit be changed to a "1" bit. Instead, flash controllers employ what is known as a "program/erase cycle" or "P/E cycle," which erases an entire "block" of memory (setting all bit values in that block to "1"), effectively "freeing up" that block of memory to be written in the future—i.e., by writing only the desired "0" values while leaving the "1" values unchanged.

But, performing one or more P/E cycles every time a host system issues a write command would be an inefficient use of time, leaving the host system waiting a relatively long time for the write to complete. Flash controllers therefore attempt to "free up" or "recycle" large numbers of blocks of flash memory as part of a "background" process (i.e., as part of their standard "garbage collection" process that reclaims unused areas of flash memory) so that a write command issued by a host system rarely directly necessitates a P/E cycle. The initial write operation to a "free" block is generally considered to be the "program" step (P) of a P/E cycle, while the subsequent "erase" (E) of that block may not occur until much later—e.g., during the flash controller's garbage collection process.

When a host system erases a file, the flash controller merely "marks" those portions of blocks containing the data as "unused." But when a host system overwrites a file (e.g., when a user modifies and saves the file), the flash controller must actually "move" the contents of that file by writing it to free blocks of flash memory, causing the prior blocks to be marked as unused and later reclaimed as part of the background garbage collection process. While all blocks are initially "free" to be written, write commands issued by a host system over time will indirectly cause a flash controller to perform multiple P/E cycles on various blocks of flash memory (a phenomenon referred to as "write amplification"). Eventually, once "almost all" (e.g., 90%) blocks have been written once, the flash controller, during its background garbage collection process, will accumulate enough "valid" (as opposed to unused) data from multiple blocks to fill an entire block, "move" that data by writing the data into a free block, and then erase the multiple blocks, thereby creating additional free blocks ready to be written as a result of subsequent host system write operations.

Flash memory chips are typically organized into multiple "logical units" or LUNS, each of which physically includes multiple "blocks" of memory, where each block is effectively the smallest erasable unit of memory on the flash chip. Each block in turn is organized into multiple "pages" of bytes. For example, a 1 TB (terabyte) flash memory drive (e.g., an SSD or other flash memory storage device) might include 8 flash chips, each of which has a capacity of 128 megabytes (1 gigabit). Each 128 MB flash chip might be organized into 4 LUNs (32 MB each), where each LUN includes 128 blocks (256 KB each), each block includes 64 pages (4K each), and each page includes 8 sectors (512 bytes each).

An SSD's flash controller serves as an interface between the individual flash memory chips in the SSD and the host computer system. As will be discussed in greater detail below, P/E cycles take a toll on the flash memory, effectively reducing the "operational lifetime" of individual flash memory chips, and thus of the entire SSD (often measured "after the fact" as the total number of P/E cycles performed on the flash memory before it "wears out"). For example, blocks of flash memory "wear" or "degrade" (used interchangeably herein) each time they are written and become less capable of being written reliably over time (a problem known as "endurance"), and, depending upon their use (e.g., in a USB thumb drive), may not be able to retain data reliably for long periods of time between writes (a problem known as "retention"). In addition, read operations on a cell of flash memory often corrupt or "disturb" the contents of neighboring cells (a problem known as "read disturb"). As will also be discussed below, flash controllers employ various techniques to manage an SSD's flash memory chips and address these endurance, retention, read disturb and other problems, so as to improve operational efficiency and extend the operational lifetime of the SSD.

It should be noted that flash memory chips also include, in addition to the physical flash memory itself, a "state machine" that implements the controller memory commands received from the flash controller. Although one could implement this state machine as a microcontroller, it is important to distinguish the functionality performed by this state machine (i.e., interpreting controller memory commands—e.g., to read and write particular areas of flash memory, and erase particular blocks) from the higher-level and more extensive functionality performed by an SSD's flash controller—such as formatting the flash memory, performing garbage collection and addressing endurance, retention, read disturb and other problems, as well as implementing system memory commands by effectively "translating" them into many lower-level controller memory commands targeted to the particular areas of flash memory in which a file's contents are or will be stored.

In addition to its state machine, flash memory chips also include control registers to store "operating parameters" (where each particular LUN on the chip has an associated set of operating parameters) that are employed by the state machine to implement controller memory commands. In order to implement any controller memory command (e.g., read, write, or erase), the state machine applies an "electrical stimulus" to the flash memory itself. Such electrical stimuli include voltage levels, for example, which are applied for a particular period of time. These levels not only depend upon the type of operation being performed (e.g., read, write or erase), but may also vary over time (e.g., increasing voltage upon a retry after a failed read operation).

The state machine applies these varying levels of electrical stimulus in accordance with the values of the operating parameters (associated with the designated LUN) stored in the control registers of the flash memory chip. For example, typical operating parameters include threshold voltage levels that differ for read, write and erase operations. They also may include start and end voltage values for each operation, as well as a duration or incremental rate/amount of change in value over time, e.g., instructing the state machine to increase a particular voltage level gradually over time (but not in excess of threshold amounts). Voltages might range, for example, from 0 to 35 volts. Other operating parameters may include, for example, a maximum number of retries (e.g., 15) before a read operation is deemed to have failed, and pass voltage values for unselected word lines, among others. Essentially any constraint on the electrical stimulus applied by the state machine can be implemented in accordance with operating parameter values stored in the control registers of the flash memory chip.

It is important, however, to distinguish variations in electrical stimulus applied by the state machine from modifications to one or more of the operating parameters during the chip's operational lifetime. For example, a state machine typically employs a "retry" mechanism to verify write operations—by retrying the write operation until all memory cells have been verified or until a specified threshold number of retries is reached, in which case the write operation will be deemed to have failed. Over time, write attempts may occur more frequently, and more retries may be necessary to achieve successful verification. The number of retries may jump from 3 to 5 to 7 over some period of time. But, the operating parameter specifying the maximum number of retries (e.g., 15) may remain fixed. Similarly, one operating parameter may specify an incremental increase (e.g., 2 volts) in the voltage level for each retry, while another operating parameter specifies the maximum voltage for write retries (e.g., 20 volts). Even though these operating parameters are designed to remain fixed, the electrical stimulus applied by the state machine (e.g., the voltage level applied during a write) will vary over time during each subsequent retry—e.g., increasing from 5V to 7V to 9V, etc.—but not exceeding 20V.

As a general rule, the operating parameters of flash memory chips are determined (with respect to each LUN) when each batch of flash memory chips is manufactured, and they typically remain fixed thereafter during the operational lifetime of the flash memory chips. A flash memory chip's operational lifetime can be said to begin after it is manufactured and incorporated into a flash memory device, such as an SSD (though it will not likely "age" or degrade significantly until it is powered up and used in the field). As a practical matter, an SSD's operational lifetime can be said to be coextensive with (and equivalent to) the operational lifetime of the flash memory chips contained therein, as the SSD cannot typically function without all of its flash memory chips (unless overprovisioned).

When a batch of flash memory chips is manufactured, the manufacturer typically performs diagnostic tests on one or more "test chips" in an effort to determine an "optimal" set of operating parameters (with respect to each LUN) that meet desired specifications—e.g., reliable read and write operations for 10,000 P/E cycles with a retention time of 6 months. This is typically accomplished by placing each chip into a "test mode" to enable the issuance of diagnostic commands that access and modify the chip's operating parameters. Once this "offline characterization" process is completed and an optimal set of operating parameters is determined for each LUN, these same optimal operating parameters are stored in the control registers of each flash memory chip in that batch.

These operating parameters are typically not expected to be modified in the field, and test mode access is generally intended to be limited to use by the manufacturer and service technicians. However, if knowledge of the diagnostic commands and the mechanism for entering and exiting the test mode can be obtained (with or without the permission of the manufacturer), then modification of these operating parameters may be possible during the chip's operational lifetime. But flash manufacturers are not always willing to provide test mode access information to third parties, as it can reveal proprietary information such as the names, values and precise functionality of the chip's operating parameters.

Once flash memory chips are manufactured and incorporated into flash memory devices, such as an SSD, their usage in the field may vary widely during their operational lifetime. For example, a USB thumb drive may be written infrequently and powered down for long periods of time until its contents are read again (requiring relatively high retention). Enterprise SSDs, on the other hand, may be read and written frequently over time (requiring relatively high endurance).

As noted above, flash memory degrades over time, depending greatly on the nature of its use. What makes a set of operating parameters "optimal" for usage in a USB thumb drive may not be optimal for use in an enterprise SSD. Moreover, no single set of operating parameters (for a given LUN) is likely to be optimal during each "stage" of a flash memory chip's operational lifetime. As flash memory degrades, for example, higher voltages may be necessary to reliably write its contents. Conversely, lower voltages may be sufficient earlier in its operational lifetime, provided that they yield sufficient levels of retention. Finally, due to manufacturing variations, flash memory chips from the same batch (and even individual blocks of flash memory) may exhibit different levels of wear in the same application.

All of this suggests that no single set of operating parameters is likely to be optimal indefinitely, and that operating parameters therefore should be varied during a flash memory chip's operational lifetime. But, without an understanding of how flash memory degrades, it is difficult to determine how and when to modify the operating parameters within each LUN of a flash memory chip, and whether other less extreme preventive measures can be employed in the interim.

As noted above, "endurance" is one of the key problems exhibited by flash memory. The application of electrical stimulus (e.g., quantity and duration of voltage levels applied cumulatively over time) gradually degrades flash memory until it eventually "wears out" and can no longer be written reliably. In other words, flash memory degrades as a result of cumulative programming (P/E cycles) that apply varying degrees of electrical stimulus (referred to herein as "stress") over time. Cumulative write and erase operations result in more frequent read errors and retries over time. Eventually, the number of retries may exceed a predetermined threshold number of retries.

The cumulative number of P/E cycles a flash memory chip (or component LUN or block of flash memory) has endured at any given time can be roughly analogized to the "age" of that chip. But the "cumulative wear" of a chip over time also depends upon the level of stress it endures during those P/E cycles. For example, higher voltages applied during a write operation will result in greater wear. One can thus estimate cumulative wear of flash memory over time (from P/E cycles) as a product of the cumulative number of P/E cycles and the level of stress applied to that flash memory.

As a general matter, the rate of wear (i.e., cumulative wear per P/E cycle) at any given time is proportional to both the number of P/E cycles and the amount of stress applied during those P/E cycles. However, this rate is not linear—due to variations in manufacturing and the fact that electrical stimulus varies over time based on the actual usage of a flash memory chip in accordance with its operating parameters. In short, no single factor can be said to determine or reflect the "health" of flash memory at any given time—i.e., its actual cumulative wear or how much life remains.

For example, two flash memory chips exposed to the same number of P/E cycles, but with different levels of stress over time, may exhibit very different levels of cumulative wear. In other words, they may be the same "age" but have very different levels of "health." If their operational lifetime is measured (after the fact) as a cumulative number of P/E cycles before they "wear out," then one may effectively live longer than the other (e.g., 50,000 P/E cycles as compared to 10,000 P/E cycles).

Moreover, variations in manufacturing may cause one flash memory chip to "wear out" faster than another, even though both were exposed to the same number of P/E cycles at the same stress levels (i.e., the same estimated cumulative wear). As will be discussed in greater detail below, certain "outlier" blocks of flash memory may wear at a faster rate than other similarly situated blocks—i.e., at a faster rate than expected based upon their estimated cumulative wear.

Although a cumulative number of P/E cycles is often used as a specification of a flash memory chip's estimated operational lifetime (just as a person's estimated lifetime may be said to be 70 years), this specification typically presumes fixed operating parameters and an assumed (typically "worst case") usage scenario. Just as a person's "lifestyle" can affect his or her health, a chip's actual usage and exposure to electrical stimulus can affect its health. While a chip's "age" can be measured in cumulative P/E cycles, this factor alone is not necessarily the best indicator of the current "elapsed life" or health of that chip. Just as an old person may be more healthy than a younger person (taking into account various health factors, such as weight, heart rate, blood pressure, cholesterol and glucose levels, etc.), the health of a chip can be assessed more effectively by monitoring various indicators of wear or degradation.

Moreover, just as a person's health can improve (and lifetime be extended) by monitoring and treating these various health factors, so too can the health of a flash memory chip improve (and its operational lifetime be extended) by monitoring various indicators of wear over time (such as bit error rates, number of read retries and program and erase timing, as well as a current cumulative number of P/E cycles), and "treating" such wear by "prescribing" certain preventive measures to reduce the rate of wear, including identifying and resting outlier blocks of flash memory and varying the chip's operating parameters over time (as discussed in greater detail below).

In other words, while P/E cycles cause wear, they are far from the only indicator of the health of a flash memory chip (or of individual blocks of flash memory). Moreover, while the cumulative number of P/E cycles ("age") always increases over time, the actual rate of wear may increase or decrease during any particular time period or "stage" of a chip's operational lifetime. In other words, while a flash memory chip's health may generally deteriorate proportionally with the cumulative number of elapsed P/E cycles, it may do so at a faster or slower rate (depending, for example, on when stress levels are increased and when certain preventive measures are employed).

It is thus apparent that the operational lifetime of a flash memory chip can be extended beyond the chip's specified estimated number of P/E cycles by adaptively varying operating parameters and taking other less extreme preventive measures in accordance with monitored indicators of health (and not just age) over time in an effort to slow the rate of (inevitable) wear.

Apart from the problem of endurance, another problem exhibited by flash memory is a limited retention time—i.e., the duration of time after flash memory is written until its contents can no longer be successfully read. This retention problem results from a leakage of charge that naturally occurs over time. Typical retention periods might range from 3 months to 10 years, depending upon the application.

But, the retention problem is somewhat inversely correlated with endurance. For example, the application of a higher voltage when writing flash memory results in a longer period of retention, but causes greater wear and thus a lower level of endurance. Moreover, frequent P/E cycles also limit endurance, but effectively minimize the retention problem because the relevant block of flash memory has relatively recently been rewritten.

Thus, one must balance the goals of maximizing endurance and retention when identifying "optimal" operating parameters and determining when to vary them, as well as when to employ less extreme preventive measures in the interim to slow the rate of wear. Prior attempts to address these problems have included "wear leveling" and "bad block management." For example, wear leveling endeavors to distribute wear evenly to blocks of flash memory by tracking writes among blocks and moving data to different blocks in an effort to distribute wear more evenly. While this technique is generally effective in allocating wear evenly among blocks of flash memory and minimizing the number of "worn out" blocks, it does not reduce the overall level of wear, nor does it address the problems posed by outlier blocks. Bad block management (i.e., avoiding usage of blocks that are "dead on arrival" or wear out early) helps to address the problem of prematurely ending the operational lifetime of a flash memory chip—e.g., by reallocating the contents of "bad blocks" to unused portions of "good blocks" of flash memory. But it also fails to reduce the overall level of wear.

While others have attempted to increase the operational lifetime of flash memory chips by varying operating parameters over time (see, e.g., U.S. patent application Ser. Nos. 12/769,208 and 12/388,366), all of these approaches have relied solely on a cumulative number of P/E cycles to assess the level of wear of the flash memory (i.e., the "age" of the flash memory, as opposed to its "health"). Moreover, some have incorporated certain functionality into the flash memory chips themselves, in a manner that creates an inherent interoperability conflict with third-party flash controllers and flash storage devices.

What is needed is a system and a set of techniques that can assess a current level of health of a flash memory chip (or component LUNs, blocks, etc.) during its operational lifetime, and can modify its operating parameters accordingly (i.e., transition to a new "health stage"), as well as employ certain less extreme preventive measures in the interim, so as to increase the chip's operational efficiency and effectively extend its operational lifetime, and thus extend the operational lifetime of the SSD or other flash storage device into which it is integrated. One must also somehow procure test mode access to the chip, directly or indirectly, in order to ensure the ability to modify its operating parameters.

SUMMARY

The present invention includes embodiments of systems and methods for increasing the operational efficiency and extending the estimated operational lifetime of a flash memory storage device (and its component flash memory chips, LUNs and blocks of flash memory) by monitoring the health of the device and its components over time and, in response, adaptively tuning the operating parameters of flash memory chips during their operational lifetime, as well as employing other less extreme preventive measures in the interim, via an interface that avoids the need for direct access to the test modes of the flash memory chips.

In an offline characterization phase, "test chips" from a batch of recently manufactured flash memory chips are used to simulate any of various usage scenarios and measure the performance effects of writing and attempting to recover (read) test patterns written with different sets of operating parameters over time (simulating desired retention periods). Software models are employed (e.g., using neural networks and other "machine learning" techniques) to generate "candidate" sets of operating parameters, which are tested on actual hardware (the test chips) to extract performance characteristics, such as "bit error rate" (BER), program and erase timing, and "voltage threshold" (Vt) windows. Candidates are "scored" in order to iteratively update the software models and generate better candidates until an "optimal" set of operating parameters is determined for each health stage of a chip's estimated operational lifetime. For each optimal set of operating parameters, alternative sets of read parameters ("waypoints") are determined based upon their ability to recover (read) data during a particular health stage.

To enable modification of the operating parameters of these test chips, an encrypted Abstract Flash Trimming ("AFT") interface to the chip's test mode is employed in one embodiment. For example, in this embodiment, flash manufacturers need only provide abstract identifiers for the read, write and erase registers (e.g., $r_1, r_2 \ldots r_x, w_1, w_2, \ldots w_y, e_1, e_2, \ldots e_z$) in which the operating parameters are stored, and need not disclose proprietary information, such as the names, values and precise functionality of the operating parameters. In other embodiments, the registers are completely abstract, without even distinguishing among read, write and erase registers (e.g., $reg_1 \ldots reg_n$). In any event, an encrypted API (easily implemented by flash chip manufacturers) permits higher-level operations (e.g., "Set Reg n to 112" or "Modify Reg n by x %") that do not reveal any of the manufacturer's proprietary information. In one embodiment, "test mode" is enabled only temporarily to permit the operation to be performed, thereby minimizing the risk of a third-party "attack" to obtain such proprietary information. In another embodiment, the values of the operating parameters can only be modified via these higher-level operations, but cannot be read. In some embodiments, a range of values for each register can be provided by the manufacturer, and precise values can then be written via the AFT interface, or incremental values can be added to or subtracted from existing values. In any event, by avoiding direct test mode access, operating parameters can be modified without revealing the flash manufacturer's proprietary information.

As a result of this offline characterization process, multiple optimal sets of operating parameters are generated with respect to each LUN of a flash memory chip, each set corresponding to a different health stage or estimated level of wear of that LUN (or, in another embodiment, of individual blocks of flash memory). In addition, for each health stage, an ordered set of multiple waypoints is generated—each waypoint representing one or more read-specific operating parameters that recovered data successfully within a predefined retention period (and thus will likely do so during the device's operational lifetime).

In one embodiment, the optimal sets of operating parameters and waypoints generated during the offline characterization process are stored in the flash controller of an SSD, while the operating parameters (with respect to each LUN) corresponding to the initial health stage are stored in the control registers of each flash memory chip of the SSD device. In another embodiment, the values of these various operating parameters are stored not as absolute values, but as relative values to the optimal operating parameter values hidden via the AFT interface (e.g., 18% lower than the unknown value determined by the flash manufacturer).

In essence, this offline characterization phase defines the duration or "maximum potential" of each health stage. Once "online" during the operational lifetime of the SSD, various measures are employed in an endeavor to extend each health stage to its maximum potential. For example, over time throughout the operational lifetime of the SSD, the flash controller monitors, computes and maintains the level of health of individual blocks (and, in some cases, even pages and sectors) of flash memory and of the LUNs containing those blocks. In one embodiment, the flash controller employs various thresholds to identify indicators of wear of particular LUNs, blocks, pages and sectors of flash memory over time (e.g., P/E count, BER, timing of program and erase operations, etc.). Upon encountering a "threshold violation" (e.g., an erase operation that exceeds a current threshold time, or a read operation that generates a number of errors in a sector that exceeds a current threshold, or perhaps completely fails to recover data), the flash controller assesses the nature of that threshold violation, in the context of the history of prior threshold violations, and determines whether to employ particular techniques to slow the rate of wear within a particular LUN during a current health stage, including the resting of outlier blocks for the rest of that health stage.

For example, the flash controller might simply store the information relating to that threshold violation for future use. Or it might also increase one or more "soft" thresholds, reflecting, for example, the fact that errors will likely increase during each health stage. Or it might also determine that a particular block is wearing unusually quickly, and temporarily "rest" that block for the remainder of the current health stage, or eventually add it to a permanent "bad block list."

In more extreme cases, it might transition a LUN to a new health stage and replace the contents of the flash memory chip registers containing the operating parameters currently associated with that LUN with the predetermined optimal set of operating parameters corresponding to that LUN's new health stage. That new optimal set of operating parameters will therefore be employed by the flash memory chip when subsequent read, write, and erase operations are performed within that particular LUN.

Another potentially serious threshold violation (though not one that necessarily will result in a transition to a new health stage) involves "read failures"—a potentially catastrophic error that could lead to the loss of data. Despite the use of an optimal set of operating parameters associated with a LUN's current health stage, a read operation in a particular block within that LUN could still result in unrecoverable errors. To minimize this possibility, the present invention employs an alternative approach to the standard "read retry" mechanism (which typically involves incrementing or changing the electrical stimulus levels on each successive retry, subject to the maximum number of retries specified in a current operating parameter). Instead, in one embodiment, each retry employs a different one of the predetermined waypoints (or relative values generated via the AFT interface) until all sectors have been successfully read (or all waypoints have been exhausted). Once a particular waypoint results in a successful read of all remaining sectors, the flash controller utilizes that waypoint for subsequent reads from that block until the block is erased and rewritten, or until a new health stage is reached. As will be described in greater detail below, waypoints are "pre-tested" and potentially applicable to a particular LUN or block based on current or historical health metrics, making read failures and even read retries less likely.

While addressing various threshold violations, the flash controller continues to monitor the level of health within all of the flash memory chips in the SSD. In one embodiment, the operating parameters are modified via the same AFT interface as was employed during offline characterization.

In one embodiment, the flash controller artificially generates wear of a hypothetical "oldest" flash memory chip, LUN or block of flash memory. In this manner, it predicts when a flash memory chip, LUN or block of flash memory will be ready to move to the next health stage, thereby enabling the flash controller to replace the relevant operating parameters (associated with that flash memory chip, LUN or block of flash memory) before it actually exhibits that level of wear (e.g., a few hundred P/E cycles "early" in one embodiment). Moreover, "challenge data" (e.g., neighboring cells with opposite bit values, or other data more likely to generate read errors) can be written to such blocks to obtain a "worst case" prediction of wear.

Various wear-prediction and other techniques can also be employed, including optimizing for factors other than maximum P/E cycles (e.g., lower ECC, faster write times, etc.), utilizing a real-time clock (RTC) as a "predictive" retention clock, providing real-time flash controller firmware updates (e.g., to change predetermined sets of operating parameter values based on subsequent offline testing during an SSD's operational lifetime), and employing temperature and other indicators of wear.

DETAILED DESCRIPTION

Figure 1:
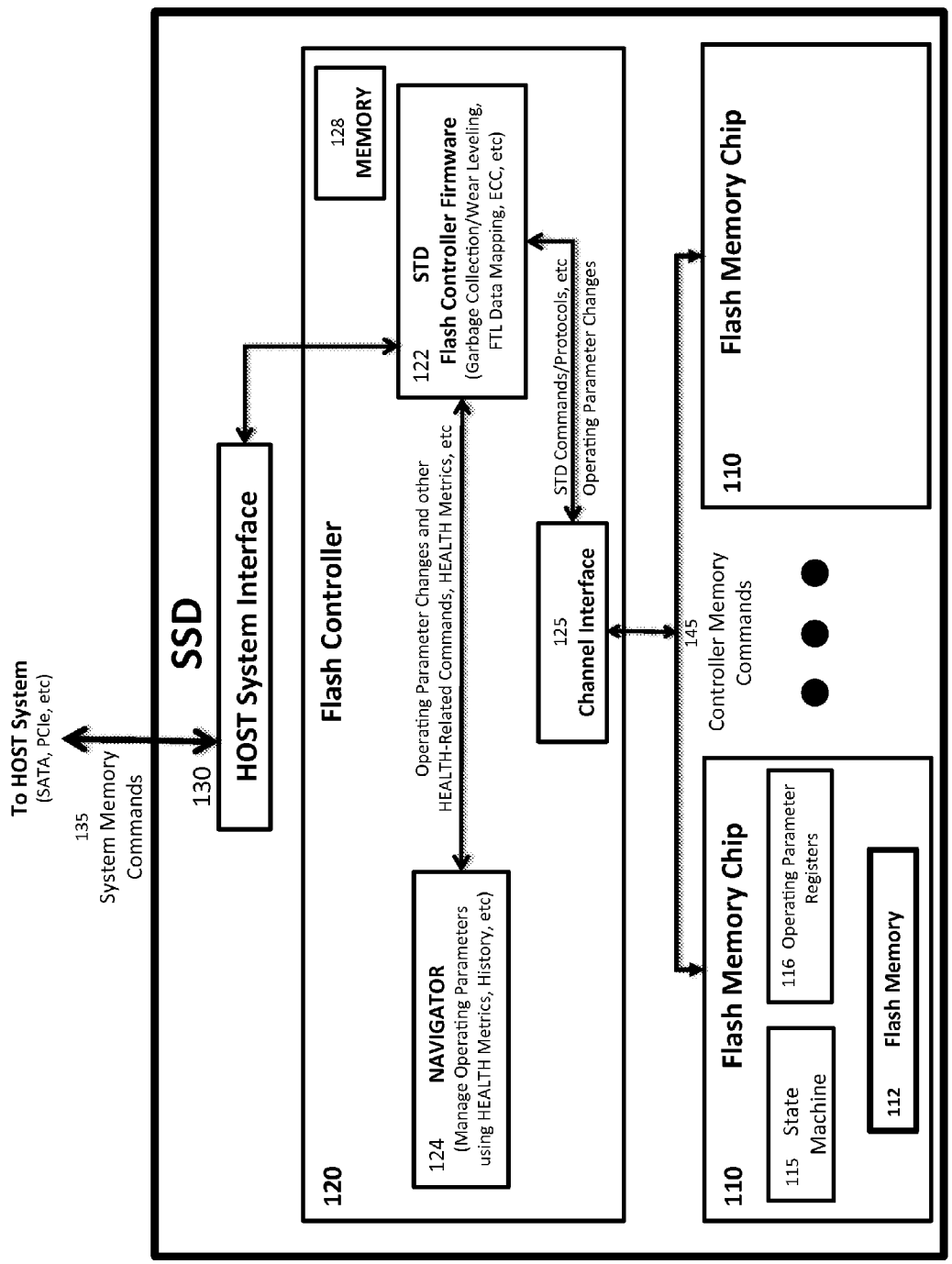
FIG. 1 is an architectural block diagram of the key components of a Solid State Drive ("SSD") in one embodiment of the present invention.

Detailed embodiments of the systems and methods of the present invention are illustrated in the accompanying Figures and described below. It should be noted at the outset that the present invention is not limited to the particular embodiments discussed below with reference to the Figures. For example, the present invention could be integrated not only into an SSD, but into virtually any other flash memory storage device, or component thereof, as well as into components of a host computer system or other computing device that accesses flash memory directly or indirectly, including a smartphone or other mobile device. Moreover, the choice of implementing aspects of the present invention partially or wholly in software or firmware, as opposed to partially or wholly in hardware, or in separate physical or conceptual components rather than an integrated component (or vice versa) is a design decision that is not essential to the nature of the present invention, except where explicitly otherwise indicated. Additional embodiments of the systems and methods of the present invention are also noted below where relevant to the discussion of particular aspects of the present invention.

I. Key Objectives

As alluded to above, one key goal of the present invention is to extend the operational lifetime of an SSD or other flash storage device. It will become apparent that the systems and methods of the present invention could be employed in other embodiments to optimize for different goals (e.g., minimizing the timing of write operations or the number of ECC bits employed for error correction, enabling cheaper hardware, as well as various other desired goals, alone or in combination) without departing from the spirit of the present invention. Nevertheless, the following detailed descriptions of the Figures will focus on the goal of increasing the operational lifetime of an SSD, while satisfying its design constraints (e.g., a minimum retention period, maximum write and erase times, etc.).

As also noted above, the operational lifetime of an SSD can be measured (after the fact) by the total number of cumulative P/E cycles performed by the SSD—just as a person's life can be measured (after the fact) by that person's age at death. But cumulative P/E cycles also serve to reduce the "life expectancy" of an SSD during its operational lifetime (e.g., due to flash memory wear)—just as cumulative aging of a person tends to reduce that person's life expectancy. One can therefore characterize a key goal of the present invention as maximizing the life expectancy of an SSD, as measured in total P/E cycles (i.e., "living to a ripe old age"), while recognizing that each P/E cycle occurring along the way (aging) serves to reduce its life expectancy.

As flash memory endures write and erase operations (i.e., P/E cycles) over time, it begins to wear—the "endurance" problem referenced above. And that wear gradually causes an increase in the frequency and severity of "read errors" when attempts are made to recover (i.e., read) data previously written to the flash memory. Moreover, read errors also appear when too much time elapses between the writing and reading of data—the "retention" problem referenced above. But read errors can, to some extent, be corrected by the use of ECC error correction techniques and read retries (including using "waypoints," as discussed below). Eventually, however, the read errors may become too frequent and too significant to correct, resulting in "read failures" or an inability to recover the data.

In the interim, however, one can modify operating parameters to apply more stress (e.g., higher write voltages) in an effort to address the retention problem and avoid, or at least delay, read failures. But, as noted above, the efforts to address retention by applying more stress to the flash memory also have the inverse effect of limiting endurance, as the added stress accelerates wear of the flash memory.

One must therefore balance endurance and retention when determining the appropriate amount of stress to apply to flash memory. Flash manufacturers do this by identifying an "optimal" set of operating parameters (per LUN) based on "worst case" scenarios that will ensure desired retention times. The result is higher stress than necessary, particularly early in the operational lifetime of the flash memory. But flash manufacturers generally do not intend for operating parameters to be modified in the field.

It is therefore important to recognize that varying the operating parameters stored in each LUN of a flash memory chip during its operational lifetime can extend its life—e.g., by increasing stress over time. As a general matter, lower stress, particularly early in life when cumulative wear is relatively low, will limit the rate of wear over time, though sufficient stress must still be employed to ensure desired retention.

In other words, it is desirable to remain in this early "health stage" of life as long as possible—i.e., for as many P/E cycles as possible until retention can no longer be ensured. As will be discussed in greater detail below, by monitoring multiple indicators of wear in a LUN (e.g., read errors or BER, timing of read, write and erase operations, etc.), and maintaining and analyzing such historical data over time, one can determine when retention is at risk and the probability of read failures is too high, and therefore make the decision to move to the next "health stage" by modifying the LUN's operating parameters in order to apply a greater level of stress going forward. Note that such historical data might also indicate that less extreme preventive measures can be employed to delay that decision and extend the current health stage, and thus continue to slow the cumulative rate of wear by applying a relatively lower level of stress.

As noted above, one can extend the life of an SSD to some extent by monitoring the cumulative number of P/E cycles (age) of a LUN, and modifying the LUN's operating parameters to increase stress as the cumulative number of P/E cycles increases. In effect, by increasing stress gradually over time, as opposed to applying a constant "worst case" scenario of high stress levels, one can slow the rate of cumulative wear and thus extend life to some extent.

However, P/E cycles alone are an insufficient indicator of actual cumulative wear—just as a person's age is an insufficient indicator of their current health. As noted above, P/E cycles themselves (aging) are a primary cause of wear—not just an estimated measure of wear. Even monitoring P/E cycles and stress levels over time would yield only an estimated level of cumulative wear. Actual cumulative wear, however, might differ significantly due to certain factors that cannot be detected merely by monitoring P/E cycles (and even stress levels) over time.

For example, as noted above, variations in manufacturing may cause certain "outlier" blocks of flash memory to "wear out" faster than others, even if all are exposed to the same number of P/E cycles at the same stress levels (i.e., the same estimated cumulative wear). As will be explained below, the present invention can detect such outlier blocks by monitoring BER, timing and other indicators of relative wear among different blocks of flash memory over time.

Figure 8:
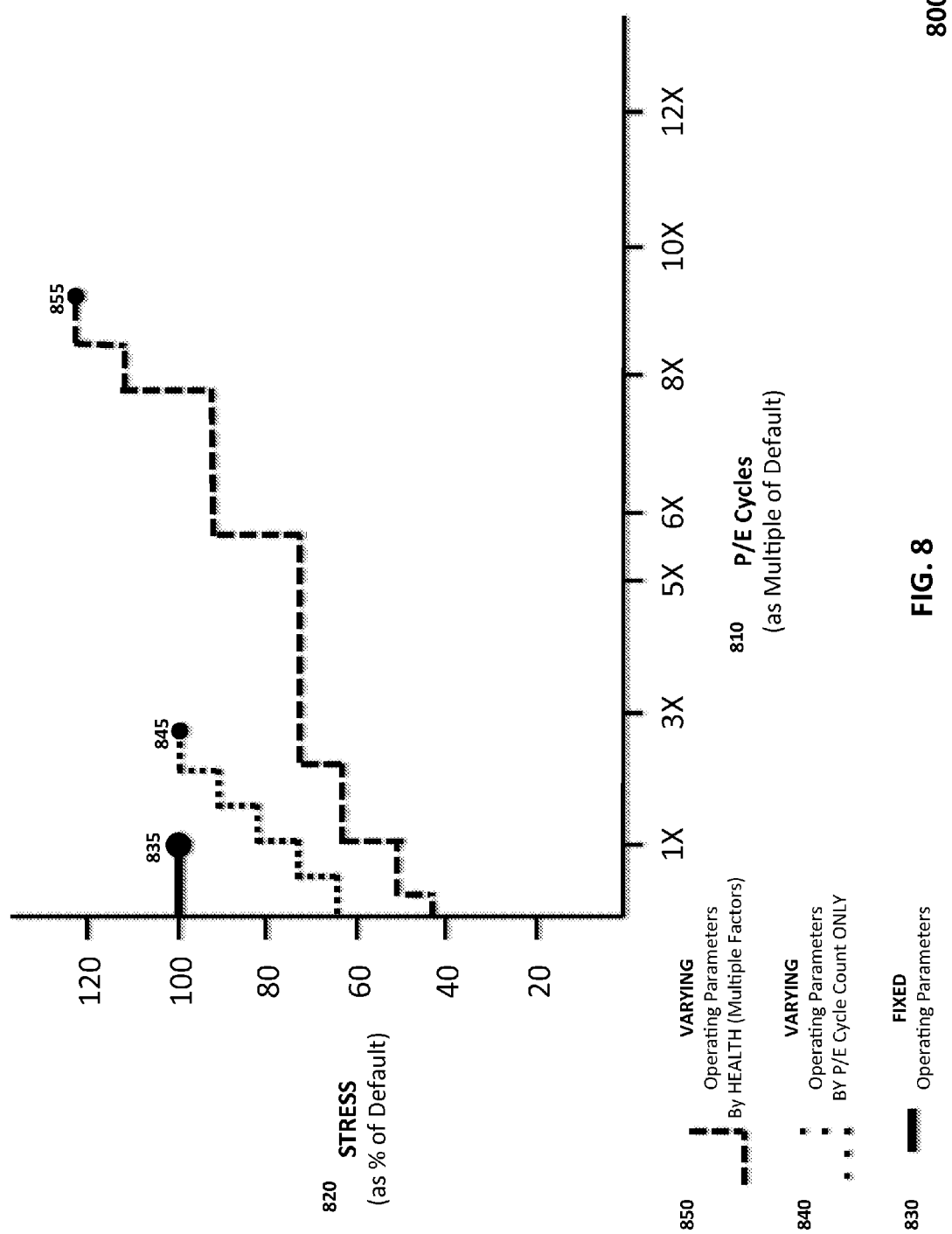
FIG. 8 is a graph illustrating how one embodiment of the present invention extends the operational lifetime of an SSD, as compared with systems that maintain fixed operating parameters during the SSD's operational lifetime, or vary operating parameters based solely on a cumulative number of elapsed P/E cycles.

But outlier blocks cannot be detected merely by monitoring P/E cycles and stress levels over time. These outlier blocks are analogous to an "illness" that can result in premature death. As a result of being unable to detect outlier blocks and distinguish them from other healthier blocks (e.g., during an offline characterization phase), stages will be shorter, resulting in an accelerated rate of cumulative wear, as discussed below with reference to FIG. 8. Moreover, failure to detect such outlier blocks during the operational lifetime of a flash storage device can result in read failures, and possibly even write failures, that will end the device's life earlier than necessary.

Thus, to achieve the goal of maximizing the operational lifetime of a flash memory storage device, it is important to monitor and detect actual cumulative wear (i.e., health) over time in order to remain in earlier health stages as long as possible (i.e., for as many P/E cycles as possible until retention can no longer be ensured), which effectively reduces the rate of (inevitable) wear, and only transition to subsequent "more stressful" health stages when necessary to ensure future retention.

As will be discussed in greater detail below, extending a current health stage is akin to "managing symptoms" to delay the need for a "major treatment." For example, outlier blocks can be "rested" for the remainder of a current health stage, effectively slowing their rate of wear by not using them, and avoiding continued generation of errors that otherwise could eventually result in read failures. Their data can be moved to other "healthier" blocks. Other errors may be recognized as resulting not from wear issues, but from retention issues (i.e., "bad data" as opposed to a "bad block"), in which case their data can be moved to another "free" block, leaving the original block available to be recycled and reused (since it is not showing signs of undue wear).

Eventually, however, LUN-wide wear is inevitable and symptoms can no longer be managed. Major treatment is required—e.g., transitioning to the next health stage by modifying operating parameters to increase stress levels. This "strong medicine" brings some relatively immediate relief. Writing data with higher stress levels reduces BER and retention concerns, but has the "side effect" of increasing the rate of wear (due to the higher stress).

As will be discussed in greater detail below, the present invention achieves the goal of maximizing the operational lifetime of a flash memory storage device by balancing endurance and retention in pursuit of the following objectives: (1) Determine Appropriate Stress Levels per Health Stage; (2) Extend Health Stages for as many P/E cycles as possible by Slowing the Rate of Wear; (3) Manage Retention to enable Extension of Current Health Stage; and (4) Determine appropriate Conditions for Health Stage Transition.

The first objective is achieved during an offline characterization phase, prior to the beginning of the operational lifetime of an SSD, which determines the number and maximum duration of health stages, and the operating parameters (including "waypoints") associated with each health stage, as explained below with reference to FIGS. 4-7. The remaining objectives are achieved by continuously monitoring the health of the flash memory in a LUN, and identifying and analyzing certain conditions to determine the appropriate action to take, as explained below with reference to FIGS. 1-3. In particular, the second objective is achieved by identifying conditions reflecting certain block-specific endurance issues, and performing appropriate preventive measures such as resting and reducing the workload of outlier blocks. The third objective is achieved by identifying conditions reflecting certain block-specific retention issues, and performing appropriate preventive measures such as moving data to another block. Finally, the fourth objective is achieved by identifying conditions reflecting certain LUN-wide health issues, and performing appropriate actions such as transitioning to the next health stage by replacing the LUN's operating parameters with those determined during the offline characterization phase.

II. SSD Architecture

Turning to FIG. 1, an embodiment of the present invention is illustrated in a flash storage device, SSD 100, which is accessed from a host system (such as an enterprise server, PC, laptop, smartphone or other device capable of accessing flash memory) via HOST System Interface 130 (in accordance with well-known standard bus interface protocols, such as SATA, PCIe, etc.). As noted above, the host system sends System Memory Commands 135 to SSD 100 via HOST System Interface 130, in order to read, write and erase files from the Flash Memory Chips 110 embodied in SSD 100.

SSD 100 also includes a Flash Controller 120 which, among other functions, implements the System Memory Commands 135 by translating them into numerous Controller Memory Commands 145, each of which is in turn implemented by the Flash Memory Chips 110. Each Flash Memory Chip 110 implements Controller Memory Commands 145 by employing a State Machine 115, which operates in accordance with a set of operating parameters stored in Operating Parameter Registers 116, to read, write and erase the contents of its Flash Memory 112.

From the perspective of a host system, System Memory Commands 135 instruct SSD 100 to write a file into its flash memory, read a file from its flash memory, or erase a file that is no longer required by the host system (e.g., when a user deletes a file). In one embodiment, these files correspond to entire files maintained by the host operating system (e.g., a user's word processing document or spreadsheet, or a "system file" used internally by the host operating system). In other embodiments, they correspond to smaller subsets of these files, such as one or more "allocation units" maintained by the operating system's file system (e.g., FAT, NTFS, etc.). In either case, SSD 100 must interpret these System Memory Commands 135, typically by relying upon a standard "flash translation layer" (FTL) to map a file into particular locations within the Flash Memory Chips 110, e.g., designating those locations by their chip, LUN, block, page and sector identifiers.

Flash Controller 120 will generally write a file into flash memory "page by page" (though operations are typically performed in parallel for enhanced performance), requiring multiple Controller Memory Commands 145 to implement the low-level write protocol and instruct the Flash Memory Chips 110 to write the contents of the file into its various designated locations (perhaps across multiple blocks, LUNs and even flash memory chips). Flash Controller 120 also generally reads files "page by page," though Flash Memory Chips 110 typically return data at a sector level to enable Flash Controller 120 to perform ECC error correction on each sector (and correct the data or retry the read operation for sectors that contain more errors than can be corrected by the ECC process). As noted above, when a host system issues a System Memory Command 135 to erase a file, Flash Controller 120 will merely "mark" those portions of blocks containing the data as "unused," to be reclaimed at a later time as part of the background garbage collection process (e.g., by writing the remaining "valid" data from various blocks into a "free" block, and recycling those previously written blocks into "free" blocks to be written in the future).

Note that Flash Controller 120 also performs other functions, discussed in greater detail below, such as wear leveling, garbage collection and ECC error correction. These other functions also require Flash Controller 120 to issue Controller Memory Commands 145 to the Flash Memory Chips 110 to implement these functions.

While the Flash Memory Chips 110 are discussed herein with reference to the characteristics exhibited by NAND flash, other types of flash memory (e.g., NOR flash, with different endurance, retention and other characteristics) can be employed without departing from the spirit of the present invention. Moreover, the number of bits per transistor cell in the Flash Memory Chips 110 (e.g., SLC with 1 bit per cell, MLC with 2 bits per cell and TLC with 3 bits per cell) will also not materially affect the nature and spirit of the present invention, though each technology may require different sets of Controller Memory Commands 145 to implement read, write and erase operations, as well as different operating parameters, and may present different tradeoffs regarding the monitoring, assessment and treatment of the health of the flash memory embodied in the Flash Memory Chips 110.

Flash Controller 120 utilizes a standard HOST System Interface 130 to communicate with a host system (e.g., to receive System Memory Commands 135), and a standard Channel Interface 125 to communicate with the Flash Memory Chips 110 (e.g., to issue Controller Memory Commands 145). Channel Interface 125 is often implemented as a distinct hardware device (typically including firmware as well) for each separate Flash Memory Chip 110, though it could also be integrated with other components of Flash Controller 120. Channel Interface 125 operates at a "channel" level, where a channel generally corresponds to a Flash Memory Chip 110 (or to a group of Flash Memory Chips 110 or LUNs connected to the same physical bus).

As noted above, one of the advantages of the present invention is that none of its functionality requires a particular manufacturer's flash memory chips, as this would limit the interoperability of the present invention with flash memory chips from other manufacturers, which in turn would violate a primary goal of the "Open NAND Flash Interface" (ONFI) Specification which, since its inception, has been to promote interoperability of flash memory chips so as to avoid changes to flash controllers when flash memory chips are replaced (see, e.g., Section 1.1 of version 1.0, as well as current version 4.0, of the ONFI Specification). Nevertheless, a flash memory chip manufacturer might elect to incorporate some or all of the functionality of the present invention into its flash memory chips without departing from the spirit of the present invention. For example, a vertically integrated flash memory chip manufacturer might also control the design of the associated flash controller (and perhaps even the design of an SSD or other flash storage device itself), in which case interoperability might be of little concern.

Flash Controller 120 incorporates standard ("STD") Flash Controller Firmwar 122 to perform many of the functions of typical flash controllers, including, for example, (i) translating System Memory Commands 135 into Controller Memory Commands 145 (via standard FTL mapping techniques); (ii) wear leveling, designed to evenly distribute P/E cycles among the various blocks of flash memory; (iii) garbage collection, to recycle previously written blocks of flash memory so that they are "free" to be written; and (iv) ECC error correction, employed to detect and correct read errors in particular sectors of flash memory during a read operation.

STD Flash Controller Firmware 122 utilizes Memory 128 to perform its various functions. Memory 128 typically consists of DRAM and SRAM or other cache memory, as well as non-volatile storage, such as dedicated flash memory separate and distinct from the flash memory on Flash Memory Chips 110. In another embodiment, the non-volatile portion of Memory 128 could be integrated into one or more of the Flash Memory Chips 110. Moreover, Memory 128 itself could be physically located outside of Flash Controller 120, or even outside of SSD 100, though it is typically located within Flash Controller 120 to enhance performance by minimizing access time.

In one embodiment, the functionality of the present invention is distributed between STD Flash Controller Firmware 122 and the Navigator module 124. In this embodiment, one of the design goals was to minimize the revisions to STD Flash Controller Firmware 122 (i.e., to leverage existing functionality and maximize interoperability with third-party flash controllers) while retaining the functionality of the present invention, much of which is incorporated within Navigator module 124. Moreover, Memory 128 is shared between STD Flash Controller Firmware 122 and Navigator module 124, though each may also carve out its own dedicated (and potentially encrypted) areas of memory.

It should be emphasized, however, that the functionality of the present invention and of standard flash controllers could be distributed differently, divided among additional physical or conceptual modules, or combined into a single integrated module, without departing from the spirit of the present invention. Moreover, while standard flash controllers are often implemented as ASIC devices, the distribution of functionality within Flash Controller 120 among software, firmware and hardware is a result of engineering design tradeoffs that are independent from the nature and spirit of the present invention. Finally, it should be noted that some or all of the functionality of the present invention could be external to Flash Controller 120, integrated within a Flash Memory Chip 110, and even located physically outside of SSD 100.

While not shown in FIG. 1, an encrypted AFT interface to the test mode of each Flash Memory Chip 110 can also be employed, as noted above, to enable Flash Controller 120 to modify the values of the operating parameters stored within Operating Parameter Registers 116, without revealing the flash chip manufacturer's proprietary information, such as the names, values and precise functionality of the operating parameters. This AFT interface could be embodied anywhere within (or potentially even external to) Flash Controller 120. A similar AFT interface can also be employed to access test chips during an offline characterization phase, as described below in greater detail with reference to FIG. 4.

Figure 2:
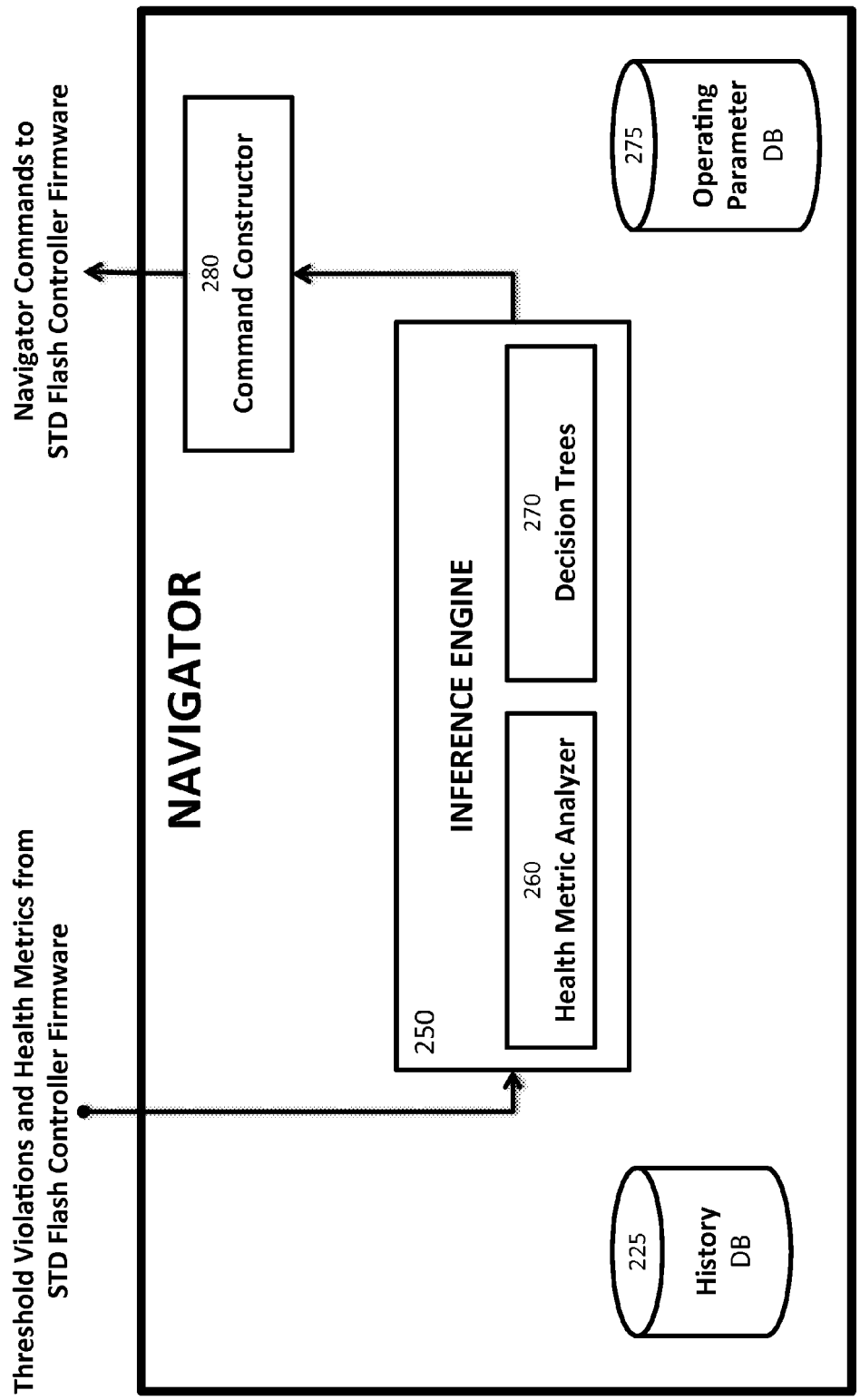
FIG. 2 is an architectural block diagram of one embodiment of the Navigator component of the present invention that modifies operating parameters and other operating characteristics of an SSD based upon an analysis of the health of the flash memory in the SSD.

The interaction between Navigator module 124 and STD Flash Controller Firmware 122, which will be explained in greater detail below with reference to FIGS. 2 and 3, relates to the monitoring and assessment of the health of the flash memory within Flash Memory Chips 110 during the operational lifetime of SSD 100, based upon historical as well as current "health metrics," and to the actions taken in response (e.g., to modify current operating parameters upon a transition to a new health stage, and to employ less extreme preventive measures in the interim to extend the duration of the current health stage).

III. Navigator

A. Navigator Architecture and Interaction with Standard Flash Controller Firmware Turning to FIG. 2, Navigator module 200, in one embodiment, receives various "health metrics" from STD Flash Controller Firmware 122, which Navigator module 200 analyzes to determine whether to generate "Navigator Commands" which, upon being constructed into the appropriate format by Command Constructor 280, are issued to STD Flash Controller Firmware 122. For example, one Navigator Command instructs STD Flash Controller Firmware 122 to modify current operating parameters (for one or more LUNs in Flash Memory Chips 110) upon a transition to a new health stage (i.e., by replacing them with the predetermined set of operating parameters stored in Operating Parameter DB 275 corresponding to that new health stage), while others employ less extreme preventive measures in the interim to extend the duration of the current health stage.

These Navigator Commands, discussed in greater detail below, are selected by Inference Engine 250, based upon an analysis of the health metrics, by Health Metric Analyzer 260, and a decision-making process implemented by Decision Trees module 270. Inference Engine 250 relies not only upon the current health metrics received from STD Flash Controller Firmware 122, but also upon historical health metric data maintained in History DB 225. In one embodiment, Operating Parameter DB 275 and History DB 225 are implemented within non-volatile (and potentially encrypted) areas of Memory 128, and shared with STD Flash Controller Firmware 122 (e.g., so it can generate the appropriate Controller Memory Commands 145 to modify a particular LUN's operating parameters). Standard performance/security tradeoffs may dictate whether information is passed "by reference" or "by value."

As noted above, it is desirable to minimize the revisions to STD Flash Controller Firmware 122 in order to leverage existing functionality and maximize interoperability with third-party flash controllers. For example, STD Flash Controller Firmware 122 is typically responsible for issuing all Controller Memory Commands 145 to the Flash Memory Chips 110 (via Channel Interface 125), which enables it to monitor and maintain a great deal of data relevant to the health of the flash memory. For example, it knows the total number of P/E cycles performed on each block of each LUN (which it uses, for example, to implement its wear-leveling process). It also maintains a "bad block list" including blocks that were designated as "bad" by the manufacturer of Flash Memory Chips 110, as well as blocks that "wear out" during the operational lifetime of SSD 100 (e.g., blocks that can no longer be written successfully). In addition, it knows the timing of read, write and erase operations, as well as how many read errors were detected in any given sector (which it uses, for example, to implement its ECC error correction process).

In one embodiment, an interrupt mechanism is employed, and Navigator module 200 provides certain thresholds (discussed in greater detail below) to STD Flash Controller Firmware 122. Upon detecting a "threshold violation" (e.g., detecting more than 10 errors in a sector while reading a page of data from the Flash Memory Chips 110), STD Flash Controller Firmware 122 issues an interrupt to notify Navigator module 200 of the threshold violation, and provides relevant health metrics pertaining to that threshold violation. Over time, Navigator module 200 analyzes and makes certain inferences from this information, and maintains an historical record of health metric data in History DB 225. In one embodiment, each time Navigator module 200 is notified by STD Flash Controller Firmware 122 of a threshold violation, it analyzes the health metrics pertaining to that threshold violation, as well as historical health metrics stored in History DB 225, to determine whether to issue one or more Navigator Commands to STD Flash Controller Firmware 122.

In one embodiment, discussed in greater detail below with reference to FIG. 3, Inference Engine 250 employs deterministic algorithms by generating particular "conditions" based upon available health metrics, and utilizing Decision Trees module 270 to determine which, if any, Navigator Commands to select based upon those conditions. In other embodiments, standard neural network or other machine-learning techniques are employed in real time to continually modify (or even regenerate) models that predict which Navigator Commands are most appropriate in light of the available current and historical health metric data. Inference Engine 250 utilizes such predictive models to in effect "train" itself over time to make better predictions that are designed to achieve one or more weighted goals (e.g., maximum P/E cycles per health stage, minimal write timing, etc.). Over time, Inference Engine 250 analyzes actual health metric data obtained from the Flash Memory Chips 110, which it uses to modify the weighting of these goals in order to improve its predictive ability.

B. Threshold Violations and Health Metrics

When SSD 100 begins its operational lifetime, Navigator module 200 has at its disposal (obtained from an offline characterization phase described below with reference to FIGS. 4-7) multiple sets of operating parameters, each set corresponding to a particular health stage (and including one or more waypoints—i.e., alternate sets of read parameters). These sets of operating parameters are stored in Operating Parameter DB 275, and the set corresponding to the initial health stage is used by STD Flash Controller Firmware 122 to replace the contents of Operating Parameter Registers 116 in each LUN of each Flash Memory Chip 110. Over time, when the health of a particular LUN dictates a change in health stage, the contents of Operating Parameter Registers 116 associated with that LUN are replaced with the set of operating parameters corresponding to that next health stage. Thus, at any given time, each LUN may be in a different health stage from that of other LUNs, whether in the same or in different Flash Memory Chips 110.

In one embodiment, Navigator module 200 monitors the health of each LUN (and, to some extent, its component blocks, sectors, pages, etc.), and provides STD Flash Controller Firmware 122 with "soft" and "critical" thresholds (associated with the current health stage of a particular LUN) for use in detecting threshold violations. These thresholds are updated upon that LUN's transition to a next health stage. The purpose of these thresholds is to filter out insignificant data that need not be reported to Navigator module 200, but still provide Navigator module 200 with advance warnings so that it can determine whether it can employ any preventive measures before the situation deteriorates to the point that a transition to the next health stage is warranted.

For example, a "critical" threshold of 36 might be employed for bit errors detected in a sector during read operations on data written with 40-bit ECC. If STD Flash Controller Firmware 122 detects more than 40 bit errors in one or more sectors during a page read, the data in those sectors are "unrecoverable" and require "read retries" in an effort to recover the data in all such sectors. If the maximum number of retries has been attempted without successfully recovering the data in all such sectors, a "read failure" has occurred. But STD Flash Controller Firmware 122 can warn Navigator module 200 in advance that a sector is getting close to the point of an unrecoverable error—e.g., once it exceeds 36 bit errors—to enable Navigator module 200 to determine, for example, whether it should transition the LUN to the next health stage, or perhaps employ less severe preventive measures.

As noted above, the bit error rate (BER) in a particular LUN or block tends to increase over time as a health stage progresses—e.g., as a result of cumulative wear. So, other "soft" thresholds (e.g., 10, 15 and 20) are also employed to provide additional advance warning to Navigator module 200 as the current health stage progresses. In one embodiment (discussed below), Navigator module 200 employs a set of soft thresholds that "increase" (in severity) in recognition of the fact that BER will likely increase throughout the current health stage. Navigator module 200 modifies the current "soft" threshold used by STD Flash Controller Firmware 122 upon detecting, for example, a cumulative number of LUN-wide soft threshold violations that exceeds an internal threshold. In this embodiment, these thresholds are updated once the LUN transitions to the next health stage (e.g., to reflect certain competing factors—such as the "less healthy" deteriorating status of the LUN, which can result in more errors, as contrasted with the higher level of stress associated with the next stage, which may initially result in fewer errors).

In one embodiment, threshold violations (TVs) are categorized into three different types: (1) soft TVs, (2) critical TVs and (3) read failure TVs (i.e., the failure to recover data in all sectors of a page read after exceeding a maximum number of read retries). Soft and critical thresholds can be defined not only for read errors (BER), but also for timing violations, such as the total elapsed time required to complete a write, erase or read operation. For example, a flash chip manufacturer may specify a maximum time constraint of 2 ms to erase a block of flash memory. To warn Navigator module 200 in advance of a potential problem, a critical threshold of 1.8 ms, and a series of soft thresholds (e.g., at 1.2 ms, 1.4 ms and 1.6 ms) may be employed.

Similar timing thresholds may be employed for read and write operations. Note, however, that timing for write operations might actually decrease as cumulative P/E cycles cause a block to degrade (e.g., due to "trapped charge" or residual voltage—say 3V—that actually makes it quicker to ramp up to a desired 5V). Nevertheless, the principle remains the same, even if the thresholds decrease in value as they increase in severity. An additional timing-related read threshold is also employed in another embodiment with respect to the percentage of waypoints utilized to complete a successful read operation (e.g., a critical threshold of 9 out of a total of 12 waypoints, and additional lower soft thresholds).

In one embodiment, Navigator module 200 maintains in Operating Parameter DB 275 a "MAX P/E Count" associated with each health stage, so that STD Flash Controller Firmware 122 can automatically transition to the next health stage when this MAX P/E Count is exceeded for any particular LUN. In this embodiment, STD Flash Controller Firmware 122 will issue a MAX P/E Count critical TV, so that Navigator module 200 can perform certain "housekeeping" tasks in between health stages, as discussed in greater detail below. In other embodiments, in light of the fact that STD Flash Controller Firmware 122 already tracks every P/E cycle (per block, as well as per LUN, for wear-leveling purposes), a TV could be issued for every P/E cycle. However, this level of granularity may not be worth the "performance tradeoff" of processing every P/E cycle, since Navigator module 200 will receive other indicators of wear, such as BER and timing TVs which also include a current cumulative P/E cycle count for the relevant block in which the TV occurred.

In one embodiment, Navigator module 200 maintains a RAM buffer for the TVs and their associated health metric data obtained from STD Flash Controller Firmware 122. As Navigator module 200 analyzes each TV, it also stores information relating to that current TV in non-volatile memory in History DB 225 which, in this embodiment, maintains only the most recently processed TV and its associated health metric data. In other embodiments, data relating to all or some subset of prior TVs may also be maintained, and data relating to "unimportant" TVs may be discarded.

The following tables illustrate one embodiment of (i) the various types of health metric data that may be provided to Navigator module 200 by STD Flash Controller Firmware 122 with respect to a current TV (Table 1), (ii) the various types of health metric data that Navigator module 200 generates and stores in History DB 225 (Table 2), and (iii) a representative set of Navigator Commands that Inference Engine 250 selects for submission to STD Flash Controller Firmware 122 (Table 3). These Navigator Commands, and the "conditions" that determine when they will be employed, will be discussed in greater detail below with reference to FIG. 3.

Turning to Table 1, each TV includes the precise address or location of the TV, which enables Navigator module 200 to determine, for example, whether prior health metric data (e.g., stored in History DB 225) applied to that same block, as well as the same LUN (e.g., to aid in detecting an "outlier" block). In other cases, a particular page (even across different blocks) may be the cause of repeated errors.

As noted above, the type of TV may be significant. For example, most TVs will be soft TVs, and may not necessitate a Navigator Command, at least until they recur with greater frequency and in combination with other historical "conditions," as will be explained below with reference to FIG. 3. Critical TVs are, of course, more likely to result in Navigator Commands, though here too the historical context will ultimately determine the appropriate action. Read Failure TVs are, in effect, a special type of very critical TV (analogous to a "disaster scenario" in that it resulted in lost data) that may indicate a "worn out" block that needs to be placed permanently on a bad block list (particularly in light of the exhaustion of all waypoints, which offer significant advantages over the standard "read retry" process).

It should also be noted that Table 1 illustrates a simple scenario in which the soft and critical TVs are assumed to be BER-related TVs. In other embodiments, the TV type also distinguishes BER-related TVs from write timing TVs, erase timing TVs, etc.

In one embodiment, the "timestamp" is implemented via a "real-time clock" (RTC) found in certain flash controllers. If a RTC is not available, other indirect means of approximating the time that a TV occurred can be employed. For example, the cumulative P/E count across SSD 100 can provide a rough approximation. Alternatively, a cumulative count of the number of read, write and erase commands (or individual read, write or erase counts) can provide a basis for inferring the actual time of the current TV.

Finally, the cumulative P/E cycle count for the block from which the TV was generated, along with a count of the number of read operations since the last write of that block, can be used for a variety of purposes. For example, it can aid in the detection of outlier blocks (e.g., when compared to the P/E cycle count of other blocks in the LUN), as well as distinguishing endurance issues ("bad block") from retention issues ("bad data")—e.g., where many reads have occurred since a block was last written, potentially pointing to a retention error that may be resolved simply by moving the data to another block. If errors in that same block occur in the near future, however, the block itself may become suspect.

TABLE 1

Health Metrics from Current TV

| CATEGORY | DESCRIPTION |
| --- | --- |
| Address | Chip, LUN, Block, Page, Sector |
| Type | Soft |
|  | Critical |
|  | Read Failure |
|  | [Could also distinguish various Timing TVs, etc.) |
| Timestamp | Actual Time of occurrence of TV |
| Block state | Cumulative P/E cycle count of Block and # Reads since last Write |

Turning to Table 2, Navigator module 200, upon processing a current TV, stores all of the health metrics associated with that current TV in History DB 225 (overwriting the prior "most recent TV" health metrics, in one embodiment). For example, if repeated BER TVs are generated within the same block, but the P/E cycle count remains unchanged, this may indicate a retention issue warranting the moving of the data to another block (as opposed to an endurance issue reflecting wear of that block).

Soft and critical block counts of TVs (since the block was last erased) facilitate the identification of outlier blocks over time, as well as the need for raising soft thresholds (e.g., to prevent Navigator module 200 from being overwhelmed with soft TVs as read errors increase as expected throughout a current health stage). LUN-wide soft and critical TV counts also facilitate the detection of LUN-wide patterns. For example, cumulative critical TVs within the same LUN may well indicate a LUN-wide problem that warrants transitioning to the next health stage.

In one embodiment, STD Flash Controller Firmware 122 maintains block and LUN counts, as it is aware of every TV that it issued. In another embodiment, Navigator module 200 is responsible for maintaining these block and LUN counts. Moreover, total TV counts (soft and critical, across a block or LUN) could be maintained instead of, or in addition to, separate soft and critical TV counts. As will be discussed below, internal thresholds are maintained by Navigator module 200 to determine when block and LUN counts are excessive, potentially requiring a Navigator Command. In one embodiment (not illustrated in Table 2), a timestamp of the last TV in each block could be maintained in History DB 225—e.g., to facilitate detection of outlier blocks, as well as distinguishing endurance (bad block) from retention (bad data) issues.

Finally, upon a transition to the next health stage, the relative number of soft and critical TVs among the blocks in a LUN is examined to determine whether a particular block is "suspicious" in that it is suspected of being an outlier block. By setting its "suspicious bit," future errors in that block across multiple health stages may in fact confirm that the block is an outlier, and perhaps should be placed on the bad block list permanently. In one embodiment, the relative block TV counts are compared, and the "worst" 10% (i.e., those with the highest TV counts) are marked as "suspicious." In other embodiments, an internal threshold of TV counts may be employed (e.g., to avoid unnecessarily marking a "good" block as suspicious). In yet another embodiment, that internal threshold is not an absolute TV count, but is instead a predefined number of standard deviations from the average TV count of other blocks.

Block and LUN counts may, in other embodiments, represent total soft and critical TVs without regard to whether the TV is a BER-related TV, a write timing TV, erase timing TV, etc. If separate counts are maintained, different internal thresholds, as well as different soft and critical thresholds, are maintained by Navigator module 200.

TABLE 2

Historical Health Metrics

| CATEGORY | DESCRIPTION |
| --- | --- |
| Current TV Health Metrics | Overwrites Health Metrics from Most Recent TV as each TV is processed |
| Block Counts of TVs | Total # Soft TVs issued for Each Block and Total # Critical TVs issued for Each Block [BOTH since Block last Erased - in one embodiment] |
| LUN Counts of TVs | Total # Soft TVs issued for Each LUN and Total # Critical TVs issued for Each LUN [Reset upon Transition to next Health Stage - in one embodiment] |
| Block "Suspicious Bit" | Set for Each Block if Block deemed "suspicious" [Determined upon Transitions to next Health Stage] |

It should be noted that, upon analyzing the health metrics from both the current TV and historical health metric data stored and maintained in History DB 225 over time, Navigator module 200 may elect to simply update History DB 225, or also generate one or more Navigator Commands. One embodiment of a representative set of these Navigator Commands is illustrated in Table 3.

Even if no Navigator Command is warranted (first row of Table 3), Navigator module 200 will update History DB 225, as described above with respect to Table 2. As noted above, soft TV errors tend to increase as a current health stage progresses, particularly after early health stages. When this trend is detected, Navigator module 200 instructs STD Flash Controller Firmware 122 to replace its current soft error threshold (e.g., relating to BER) with a next higher threshold (second row of Table 3). This may occur multiple times throughout a current health stage until a "top" (most severe) soft threshold is utilized (at which point a critical TV may be on the horizon).

As noted above, certain historical health metric data may identify a potential ("bad data") retention error (e.g., when repeated read errors are detected despite the P/E cycle count remaining unchanged), in which case the problem may be resolved by moving the data to a "free" block, and recycling the existing block (third row of Table 3). Should that recycled block exhibit problems in the future, it may be deemed a "suspicious" block (e.g., at the end of a current health stage), and perhaps eventually be placed on the permanent bad block list.

As noted above, when a particular block becomes suspected of being an outlier block that is wearing faster than other blocks in the LUN, there are a number of preventive measures that Navigator module 200 can employ before "condemning the entire LUN" by transitioning to the next health stage and modifying the LUN's operating parameters. In some cases, STD Flash Controller Firmware 122 may support the concept of "priority data"—based upon knowledge of different categories of data that require different levels of usage (e.g., image databases that are relatively rarely modified). In that scenario, Navigator module 200 may reduce the priority level associated with the suspected outlier block, causing STD Flash Controller Firmware 122 to utilize that block for lower priority (less used) data, at least for the remainder of the current health stage (after which it may be marked "suspicious" and await further errors before taking more drastic action (fourth row of Table 3). In another embodiment, one or more priority levels may even be capable of withstanding uncorrectable errors (e.g., a movie, in which a small glitch might not even be noticed).

When the level of suspicion regarding a potential outlier block increases, a possible next step may be to prevent that block from being used temporarily—e.g., in one embodiment, for the remainder of the current health stage (fifth row of Table 3). While most flash controllers maintain only a permanent bad block list (and thus cannot remove bad blocks from the list), Navigator module 200 can, in one embodiment, "rest" a potential outlier block by artificially adding a predefined number to the P/E cycle count associated with that block and used by STD Flash Controller Firmware 122 for wear leveling purposes. As a result, the block will not be used because STD Flash Controller Firmware 122 will assume that it has already incurred an unusually large number of P/E cycles relative to other blocks in the LUN. But, by subtracting that large number (e.g., at the end of the current health stage), Navigator module 200 can effectively "unrest" the block so that it will be used in subsequent health stages or later in the current health stage. In effect, the outlier block was wearing faster than average, but that rate of wear was effectively slowed down, at least temporarily. At some point, it may exhibit outlier behavior in a future health stage, and may warrant being placed on the bad block list permanently (the next most serious Navigator Command in this embodiment, illustrated in the sixth row of Table 3).

Finally, when the effects of wear become so significant that they indicate a LUN-wide problem (e.g., across many blocks in the LUN, as opposed to a few outlier blocks), then Navigator module 200 will transition to the next health stage and instruct STD Flash Controller Firmware 122 to replace the contents of Operating Parameter Registers 116 (associated with that LUN) with the set of operating parameters corresponding to that next health stage (seventh and final row of Table 3). In one embodiment, this transition occurs automatically when a predefined MAX P/E Count (for a particular LUN) is reached. As will be discussed in greater detail below with reference to FIGS. 4-7, an automatic transition is warranted because retention was tested successfully in the offline characterization phase only for that maximum number of P/E cycles (at which point it was determined that a new health stage with higher stress levels was warranted). In another embodiment, the MAX P/E Count may be treated as merely one of many wear indicators, and not necessarily warrant a health stage transition.

It should be noted that, in this embodiment, no Navigator Commands relating to "read retries" are included in Table 3—i.e., because STD Flash Controller Firmware 122 is responsible for managing the "read retry" process, and only informs Navigator module 200 (apart from BER and read timing TVs that may occur along the way) if the read operation proves unsuccessful (i.e., a read failure TV) after exhausting all waypoints. In this scenario, the maximum number of retries is equal to the total number of available waypoints.

These waypoints have been tested and ordered (based upon their likelihood of recovering data during a particular health stage) during an offline characterization phase, and are accessible to STD Flash Controller Firmware 122 via Operating Parameter DB 275. They are more likely to recover data than via the conventional approach of simply repeatedly varying read thresholds. In other words, before each read retry, a next waypoint is used (i.e., by replacing the current read parameters with that waypoint). This process of cycling through the waypoints in order continues until the data from all sectors of a page read have been recovered, or all waypoints have been exhausted.

In an alternative embodiment, Navigator module 200 could be notified of a special critical BER TV, which indicates that a sector had unrecoverable data (e.g., 41 bit errors that could not be corrected with 40-bit ECC). In that scenario, Navigator module 200 would control the process of cycling through the waypoints, and might reorder them based upon real-time health metrics or other factors that suggest a different ordering than was indicated during the offline characterization phase.

TABLE 3

Navigator Commands

| NAVIGATOR COMMAND | DESCRIPTION |
| --- | --- |
| NONE | No action - just Update History |
| Raise Soft Error Threshold | Switch to next higher Soft Error Threshold (if not already at Top one) |
| MOVE Block Data | Move Data to another "free" Block |
| REDUCE Block Usage | Drop Priority Level for Block so it will be used for data types that receive less usage (IF feature available on flash controller) |
| REST Block (Stage) + Move Data | Artificially cause Block not to be used for the remainder of the current Health Stage |
| BAD BLOCK List (Permanent) + Move Data | Cause Block to be placed on Bad Block List permanently |
| TRANSITION to Next Health Stage | Replace Operating Parameters with those associated with Next Health Stage |

C. Dynamic Operation of Navigator

Figure 3:
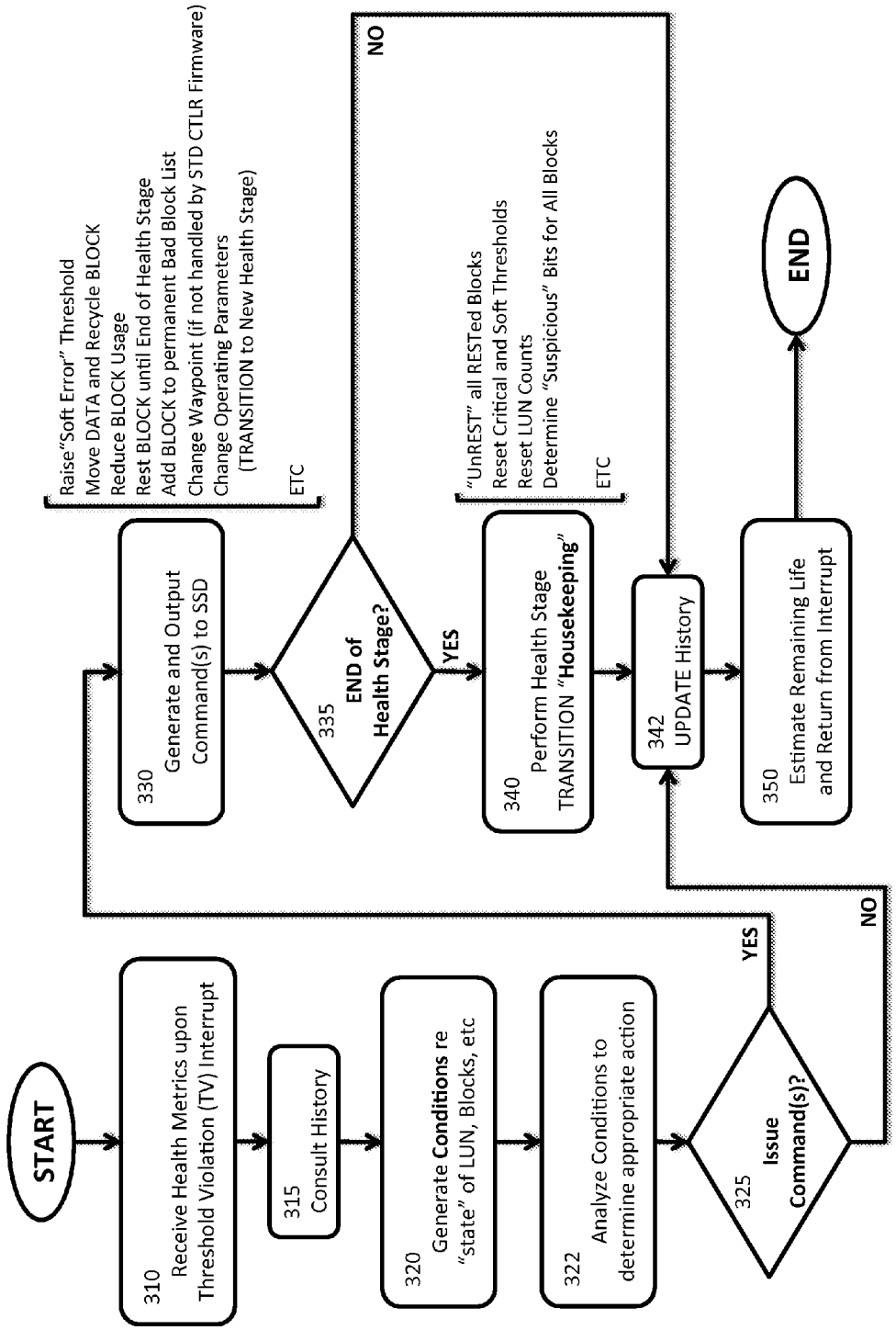
FIG. 3 is a flowchart illustrating one embodiment of the dynamic operation of the Navigator component of the present invention.

Turning to FIG. 3, flowchart 300 illustrates one embodiment of the dynamic operation of Inference Engine 250, which receives and processes TVs, and, based upon the health metric data pertaining to the current TV, as well as historical health metric data from History DB 225, generates and analyzes "conditions" that determine which, if any, Navigator Commands it will issue to STD Flash Controller Firmware 122 via Command Constructor 280.

When STD Flash Controller Firmware 122 initiates a TV interrupt, Inference Engine 250 is notified of the TV and receives, in step 310, the health metrics associated with that TV, as explained above with reference to Table 1. For example, if the Flash Memory Chips 110 were performing a read operation, and STD Flash Controller Firmware 122 determined that the data revealed one or more sectors having more bit errors than the current soft threshold, it would issue a TV for each such sector. The health metrics would include the "location" or address of the TV (e.g., its Chip, LUN, Block, Page and Sector ID), its type (soft TV, and perhaps soft BER TV), a timestamp indicating as precisely as possible when the TV occurred and the state of the block in which the TV occurred (e.g., the cumulative number of P/E cycles endured by that block, as well as the number of read operations performed on that block since it was last written).

Inference Engine 250 also consults History DB 225, in step 315, to retrieve historical health metrics in addition to those relating specifically to the current TV, as explained above with reference to Table 2. For example, those historical health metrics include, in this embodiment, separate counts of soft and critical TVs in the block in which this current TV occurred (since the block was last written), as well as separate counts of soft and critical TVs in the LUN in which this current TV occurred (e.g., since the beginning of the current health stage). In addition, Inference Engine 250 can determine whether the "suspicious" bit was set for the block in which this current TV occurred (e.g., after the previous health stage).

Inference Engine 250 then utilizes this current and historical health metric data to generate, in step 320, a set of "conditions" that will enable it to determine whether to issue one or more Navigator Commands (to STD Flash Controller Firmware 122) in response to the current TV. As noted above, this division of labor between Navigator module 200 and STD Flash Controller Firmware 122 is a result of engineering design tradeoffs. In other embodiments, Flash Controller 120 could implement all of this functionality as a single physical or conceptual unit, or utilize other units within or external to SSD 100. As also noted above, the decision to implement Inference Engine 250 by utilizing deterministic algorithms (e.g., by generating particular conditions based upon available health metrics, and utilizing Decision Trees module 270 to determine which, if any, Navigator Commands to generate based upon those conditions.) is another engineering design tradeoff. In other embodiments, standard neural network or other machine-learning techniques are employed in real time to continually modify (or even regenerate) models that predict which Navigator Commands are most appropriate in light of the available current and historical health metric data.

Before discussing the analysis of the conditions and the determination of whether to issue one or more Navigator Commands (in steps 320, 322 and 325), the remainder of the steps in flowchart 300 will be explained. Regardless of whether a Navigator Command is warranted, Inference Engine 250 updates History DB 225 in step 342 (e.g., to increment the soft or critical TV counts due to the current TV, as well as to replace the health metrics relating to the most recent TV with those of the current TV).

If one or more Navigator Commands is warranted, those commands will, in step 330, be generated via Command Constructor 280 and issued to STD Flash Controller Firmware 122. If the end of the current health stage for a LUN has been reached (tested in step 335), then Inference Engine 250 will, in step 340, perform various "housekeeping" tasks during this transition, such as "unresting" any blocks that had been rested during the health stage, and resetting soft and critical thresholds as well as (in one embodiment) LUN counts. In addition, as discussed above, the total TV counts for the blocks in the LUN will be compared to determine whether to set the "suspicious" bit of one or more blocks (i.e., because they have generated more TVs than the "average" block).

Once this housekeeping step 340 is completed (or if not at the end of the current health stage per step 335), History DB 225 is then updated in step 342 as noted above, and Navigator module 200 returns from the current TV interrupt in step 350. In one embodiment, before returning from the interrupt, Inference Engine 250 determines an "estimated remaining life" of SSD 100.

In this embodiment, the estimated remaining life reflects the estimated cumulative wear—e.g., by summing, for all prior health stages, the product (for each health stage) of the P/E cycle count generated during that health stage and the level of stress applied during that health stage (e.g., as a percentage of the stress level specified by the manufacturer of Flash Memory Chips 110). This percentage of the manufacturer's specified stress level is determined, in one embodiment, by comparing the relative values of the operating parameters employed by Flash Controller 120 during each health stage with the fixed set of operating parameters specified by the manufacturer. For example, if the relative values for a given health stage average 90% of the average manufacturer values, then the P/E cycle count for that health stage would be multiplied by 0.9.

This "estimated remaining life" is then used by Navigator module 200 during subsequent health stages (e.g., as a "condition" affecting future decisions regarding Navigator Commands). In one embodiment, the estimated cumulative wear is compared to the "expected" cumulative wear (i.e., the same formula but using the expected maximum number of P/E cycles per stage, rather than the actual number of P/E cycles). In that embodiment, if the estimated cumulative wear exceeds the expected cumulative wear, a health stage transition is automatically warranted (i.e., indicating that the flash memory is wearing faster than expected, requiring an early health stage transition). In another embodiment, once a threshold amount of remaining life is reached (e.g., less than 10% remaining), an LED on SSD 100 is turned on to notify the user to replace Flash Memory Chips 110, if such functionality is available, or otherwise to replace entire SSD 100. In yet another embodiment, an "imminent failure" notification is provided (e.g., to the host) so that various other actions may be taken in response.

Returning to the analysis of the conditions and the determination of whether to issue one or more Navigator Commands, one embodiment of the set of conditions generated by Inference Engine 250 in step 320 is illustrated in Table 4 below. Each column represents a condition, and each row represents a particular Navigator Command that is generated as a result of a particular combination of conditions being satisfied. The cells in each row of Table 4 indicate a particular combination of conditions that are either satisfied ("Y"), not satisfied ("N") or ignored ("#"—i.e., "don't care") by Decision Trees module 270 in determining whether the Navigator Command corresponding to that row should be issued.

It should be noted that Table 4 is not intended to be a comprehensive list of conditions or decision-making algorithms, but is instead meant to illustrate how certain combinations of conditions affect the decision-making process. It will be evident to one skilled in the art that a myriad of other conditions, and algorithms for making "Navigator Command decisions" based upon those conditions, could be employed without departing from the spirit of the present invention. Note also that certain Navigator Commands appear in more than one row, in an effort to illustrate how different scenarios (combinations of conditions) might result in issuance of the same Navigator Command. Finally, it should be noted that, in other embodiments, multiple Navigator Commands are generated in response to a single TV.

Looking at the columns of Table 4 (order not being relevant in this embodiment), the condition in the leftmost column indicates whether the current TV is a critical one, while the next column indicates whether the current soft error threshold is at the "top" limit. As noted above, in some embodiments, separate soft and critical thresholds may be employed to distinguish BER-related TVs from write timing TVs, erase timing TVs, etc. In that scenario, the precise TV type is employed to distinguish whether the current soft error threshold is at the top limit for that particular TV type.

As noted above, Navigator module 200 provides multiple levels of soft error thresholds to STD Flash Controller Firmware 122. For example, it may initially provide a soft BER threshold of 10 bit errors, and as it sees more errors accumulate during the current health stage, raise that threshold to 15, then 20 and finally to 25. But, it will not continue to raise that threshold indefinitely in this embodiment because the number of errors is approaching the critical threshold—e.g., 36 with 40-bit ECC. So, in this scenario, once it raises the soft threshold to 25, that is considered the "top" limit. In other embodiments, analogous sets of thresholds are employed for non-BER types of TVs.

The condition in the next column relates to a total (soft and critical) TV count for the particular block in which the current TV occurred. In one embodiment, that total reflects all types of TVs (BER, timing, etc.), while in other embodiments, separate counts are maintained for the different types of TVs, and separate counts for soft v. critical TVs as well. In any case, the central purpose of this condition is to distinguish TVs accumulating in this block from those in other blocks, so that Inference Engine 250 can detect a trend indicating that this block is an outlier block.

In one embodiment, the blocks in the relevant LUN (in which the current TV occurred) are compared to one another to determine whether the relevant TVs in this block differ by one or more standard deviations from the average of those in other blocks. In this embodiment, the required number of "threshold" deviations is initially relatively high (in recognition of the fact that errors tend to increase over the course of a health stage), and is lowered over time as the health stage progresses.

The conditions in the next two columns relate to LUN-wide counts. For example, in one embodiment, two separate LUN-wide counts are maintained—one for a total number of soft TVs (of all types—BER, timing, etc.), and one for a total number of critical TVs (also of all types). An internal threshold is defined for each of these two LUN-wide counts. In other embodiments, separate LUN-wide counts could be maintained for different types of TVs (BER, timing, etc.), or a single total LUN-wide TV count be maintained for all TVs (soft, critical, BER, timing, etc.). As will be discussed below, the accumulation of soft TVs (exceeding a predefined internal threshold) may represent a distinctly different scenario (e.g., indicating that a soft TV threshold should be increased, as more TVs accumulate while the current health stage progresses) than does an accumulation of critical TVs (e.g., indicating that many blocks in the LUN are exhibiting undue wear, and that perhaps a transition to a next health stage is warranted).

The condition in the next column reflects whether the block in which the current TV occurred is already "suspicious" (e.g., based on an unusually high TV count during the previous health stage). If so, the current TV may, for example, be more likely to result (when considered in combination with other conditions) in the block being placed permanently on the bad block list.

The condition in the next column indicates whether the cumulative P/E cycle count for the block in which the current TV occurred has changed since the most recent TV (e.g., potentially indicating that the problem may be one of retention, rather than block wear). The condition in the final column indicates whether the TV is a read failure TV, a very serious condition indicating that data loss has occurred (potentially implicating the relevant block, which may well result in that block being placed permanently on the bad block list).

The individual rows in Table 4 will now be discussed, to illustrate how particular combinations of conditions are analyzed in step 322, which may (as reflected in decision step 325) result in the issuance of particular Navigator Commands in step 330. The first row illustrates a scenario in which no "key" condition is met, and thus no Navigator Command is warranted per decision step 325, and control returns to step 342 to update History DB 225.

For example, one of the most common scenarios (particularly early in a health stage) is a soft TV in a block which is neither "suspicious" nor deviating from other blocks due to this current TV (i.e., not an outlier block), and which does not cause the LUN-wide soft TV threshold to be exceeded. In this common scenario, no Navigator Command is warranted, and Inference Engine 250 will effectively wait until more TVs occur to take any action. Other conditions are not relevant in this case (e.g., whether the "top" soft TV limit has been reached or whether the P/E cycle count in this block has changed since the most recent TV) because no troubling wear indicators have yet emerged.

As the health stage progresses and soft TVs begin to accumulate, these early warnings eventually indicate a slightly more serious situation, as illustrated in the second row of Table 4. For example, once the current soft TV causes the LUN-wide soft TV count to be exceeded (but not the LUN-wide critical TV count), and the top soft error threshold has not yet been employed, then these wear indicators suggest that the soft error threshold should be increased. In other words, the large number of soft TVs has not yet resulted in a sufficiently serious LUN-wide condition (even if the block was deemed "suspicious" and may be an outlier). Before any significant block-wide or LUN-wide conclusions are drawn, increasing the soft error limit will provide additional "early warnings" before more serious action is warranted (such as resting a block, permanently placing it on a bad block list, or even transitioning to the next health stage). In another embodiment, multiple Navigator Commands might be warranted in this scenario. For example, in addition to raising the soft error limit, a suspicious outlier block might also be rested as a preventive measure.

The third row of Table 4 illustrates a slightly different scenario, in which a critical TV occurs in a block in which the P/E cycle count has not changed since the most recent TV. Yet, the block is neither suspicious nor appears to be deviating from the norm, and no LUN-wide soft or critical TV count threshold has been exceeded. This scenario therefore suggests "bad data" (i.e., a retention error or read disturb error) rather than a "bad block" (endurance error due to wear). To address this "critical" error before a read failure occurs, the "move data" Navigator Command is issued to move the data to another ("free") block, which should alleviate the retention issue. The original block can also be recycled and used again (though the historical data from History DB 225 could eventually reveal a separate wear problem with this block). It should be noted that, merely monitoring cumulative P/E cycles would not reveal this distinction between "bad data" and a "bad block," and the failure to detect this distinction could ultimately result in retention-related read failures.

As soft TV errors continue to increase during the current health stage, repeated soft TV errors in a particular block may eventually reveal an outlier block (as illustrated in the fourth row of Table 4), despite the lack of any LUN-wide implications (in soft or critical TV counts). Even if the block has not previously been deemed "suspicious," it may be advisable to reduce the usage of this block (e.g., before it incurs a more severe critical TV). If different "priority data" levels are supported in STD Flash Controller Firmware 122, then a "reduce usage" Navigator Command is issued to reduce the priority level of the data to be written into this block (at least until the block can be reassessed at the end of the current health stage). If this feature is not available, then the block may need to be "rested," as discussed below.

Eventually, a critical TV may cause a block to be revealed as an outlier block, as illustrated in the fifth row of Table 4, despite the lack of any LUN-wide implications. In that case, the block warrants being "rested" (and the data moved to another "free" block). As discussed above, although the concept of temporarily "resting" a block is not typically available in flash controllers, an indirect approach is employed in one embodiment to achieve the same result. For example, the P/E cycle count for the block is increased artificially by adding a predefined number to the block's current P/E cycle count, causing the wear-leveling algorithm in STD Flash Controller Firmware 122 to prevent this block from being used (i.e., because it assumes the block has already incurred an unusually large number of P/E cycles relative to other blocks in the LUN). As noted above, this amount can be subtracted at the end of the current health stage or later in the current health stage, effectively "unresting" the block. Eventually, in future health stages, the block may exhibit enough wear to warrant being placed permanently on the bad block list. In any event, the rate of wear (from the perspective of the entire LUN, as well as this block) has been reduced, thereby extending the length of the current health stage and reducing cumulative wear due to the relatively lower stress levels being applied during the current health stage.

Another scenario warranting the resting of a block is illustrated in the sixth row of Table 4. Even a soft TV may cause the block to be revealed to be an outlier (even though the block was not designated as a "suspicious" block in a prior health stage). Given the lack of any LUN-wide implications, resting the block is an appropriate preventive measure. In another embodiment, after resting the block in either of the scenarios illustrated in the fifth and sixth rows of Table 4, the block could be "unrested" during the current health stage (e.g., based on other health metrics indicating that the health of this block has improved), rather than waiting until the transition to the next health stage.

The seventh row of Table 4 illustrates an even more serious scenario in which a critical TV occurs in a block previously marked as "suspicious." In that scenario, assuming no LUN-wide implications, the Navigator Command will instruct STD Flash Controller Firmware 122 to permanently place the block on the bad block list (to avoid possible future read failures). Similarly, if a read failure TV occurs in such a block (as illustrated in the eighth row of Table 4), the same Navigator Command is warranted (though such read failures are generally avoided as a result of reacting to earlier warnings).

Finally, the last two rows of Table 4 illustrate the most serious scenarios, which warrant a transition to the next health stage and a replacement of operating parameters. The second-to-last row of Table 4 illustrates the scenario in which a critical TV causes the LUN-wide critical TV count to exceed its predefined threshold, whereas the last row illustrates the scenario in which a soft TV causes the LUN-wide soft TV count to exceed its predefined threshold, and the soft error threshold is already at its top limit. In both of those cases, a transition to the next health stage (with higher stress levels) is warranted due to the accumulation of LUN-wide TVs whose "symptoms" cannot be addressed, as they are not isolated to particular outlier blocks. By transitioning to the next health stage before read failures begin to occur, the operational lifetime of SSD 100 is effectively extended.

As noted above, though not illustrated in Table 4, STD Flash Controller Firmware 122 will automatically transition to the next health stage (and notify Inference Engine 250) in the event it detects that the MAX P/E Count (associated with the current health stage) has been exceeded. In this case, a transition to the next health stage is warranted because retention has only been tested up to this MAX P/E Count (as will be explained below with reference to FIGS. 4-7).

Additional alternative embodiments of Navigator module 200 will be discussed below, after discussing the offline characterization phase (in FIGS. 4-7) in which optimal sets of operating parameters associated with each health stage are determined—prior to the beginning of the operational lifetime of SSD 100.

TABLE 4

Navigator TV Processing

| | CONDITION | | | | | | | |
|---|---|---|---|---|---|---|---|---|
| COMMAND | Critical TV | TOP Soft Error Limit | BLOCK TV Count > Deviation | LUN Soft TV Count > MAX | LUN Critical TV Count > MAX | BLOCK already Suspicious | P/E Unchanged from Most Recent TV | Read Failure |
| NONE | N | # | N | N | N | N | # | N |
| Raise Soft Error Threshold | N | N | # | Y | N | # | # | N |
| MOVE Block Data | Y | # | N | N | N | N | Y | N |
| REDUCE Block Usage | N | N | Y | N | N | # | # | N |
| REST Block (Stage) + Move Data | Y | # | Y | N | N | N | # | N |
| REST Block (Stage) + Move Data | N | Y | Y | N | N | N | # | N |
| BAD BLOCK List | Y | # | # | N | N | Y | # | N |

TABLE 4-continued

Navigator TV Processing

| COMMAND | Critical TV | TOP Soft Error Limit | BLOCK TV Count > Deviation | LUN Soft TV Count > MAX | LUN Critical TV Count > MAX | BLOCK already Suspicious | P/E Unchanged from Most Recent TV | Read Failure |
|---|---|---|---|---|---|---|---|---|
| (Permanent) + Move Data | | | | | | | | |
| BAD BLOCK List (Permanent) + Move Data | N | # | N | N | N | Y | # | Y |
| TRANSITION to NEXT Health Stage | Y | # | # | # | Y | # | # | N |
| TRANSITION to NEXT Health Stage | N | Y | # | Y | N | # | # | N |

It should be emphasized that, by monitoring not just cumulative P/E cycles (age), but also various indicators of wear (including those illustrated in Tables 1 and 2 and described above), Navigator module 200 is able to satisfy the key objectives set forth above. By distinguishing retention issues ("bad data") from endurance issues ("bad blocks"), data can be moved to extend health stages while minimizing read failures and repeated read retry attempts. Health stages are also extended by detecting and resting or reducing the usage of outlier blocks, effectively delaying inevitable LUN-wide ramifications (as well as unnecessary read retry attempts and read failures), until health stage transitions (and modification of operating parameters to increase stress levels) are eventually required in order to continue to ensure data retention.

In one embodiment, the appropriate stress levels to be applied during each health stage (i.e., the appropriate corresponding sets of operating parameters, including waypoints), as well as the expected number and maximum length of health stages (reflected, for example, in a cumulative or per-stage MAX P/E Count) are determined prior to the beginning of the operational lifetime of SSD 100. In this embodiment, such determinations are made during an offline characterization phase described below with reference to FIGS. 4-7.

IV. Offline Characterization Phase

A. Key Objectives

Figure 4:
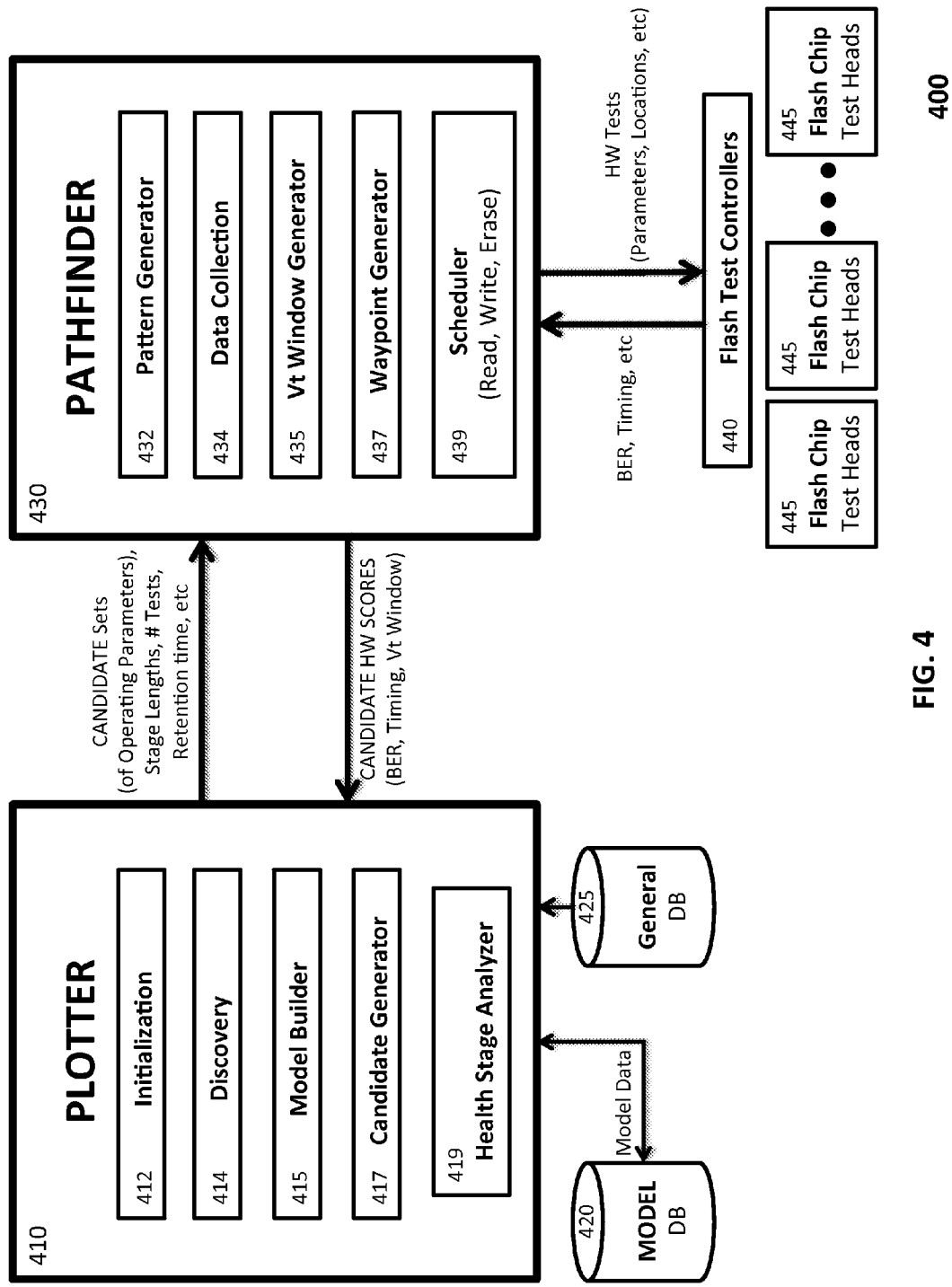
FIG. 4 is a block diagram of one embodiment of the Plotter and Pathfinder components of the present invention that work together to generate (in an offline characterization phase prior to the start of an SSD's operational lifetime), optimal sets of operating parameters for use by Navigator at different health stages of the SSD's operational lifetime.

Turning to FIG. 4, block diagram 400 illustrates one embodiment of key components of the present invention that implement the offline characterization phase of the present invention. Before examining these components, it is important to recognize that a general overall objective of this offline characterization phase is to identify sets of operating parameters that apply the least amount of stress to the flash memory for the most number of P/E cycles, while yielding the longest retention times. In other embodiments, principles of the present invention may be employed to consider and optimize for other factors, such as minimal read, write and/or erase times, lowest ECC, etc.

But, as noted above, these key factors (stress, P/E cycles and retention) are in conflict with one another. Lower stress facilitates longer endurance, but may be insufficient to ensure desired retention. Higher stress facilitates longer retention times, but limits endurance, particularly as more P/E cycles accumulate. Thus, it is apparent that these competing goals must be balanced throughout the offline characterization phase.

It is also important to recognize that certain design and performance constraints must be taken into account. For example, the manufacturer of Flash Memory Chips 110 specifies certain guaranteed or expected performance characteristics, including retention time (e.g., 1 year), expected cumulative P/E cycles (e.g., 5000 P/E cycles), ECC capability (e.g., 60 bits) and various timing constraints (e.g., maximum erase times of 2 ms).

While these general-purpose manufacturer specifications enable a variety of different applications, companies who make flash storage devices, such as SSD 100, may have different design constraints reflecting their particular application. For example, they may want to maximize P/E cycles (e.g., 30,000 P/E cycles, rather than just 5000), while limiting guaranteed retention times (e.g., to only 3 months) and ECC requirements (e.g., 40-bit ECC). In other words, if they do not expect the Flash Memory Chips 110 in SSD 100 to be written as infrequently as they would in a USB thumb drive, for example, then a 3-month retention time may be sufficient, particular in light of the greater expected frequency of P/E cycles. And while performance concerns might dictate that the chip manufacturer's timing constraints not be relaxed, the company making SSD 100 might conclude that, since decoding more bits of ECC impacts performance, a 40-bit ECC specification is an appropriate security/performance tradeoff. In another embodiment, SSD 100 could be reconfigured in the field to support a desired application—e.g., via a firmware update that replaced some or all of the optimal sets of operating parameters.

These various design constraints are considered at the outset of the offline characterization phase by Initialization module 412, which initializes variables representing these constraints, as well as each operating parameter register. For example, in this embodiment, we can assume an initial offline characterization goal of at least 30,000 P/E cycles and a required 3-month minimum retention time with 40-bit ECC (as well as various flash chip manufacturer-driven timing constraints). Moreover, in this embodiment, the number of health stages and maximum number of P/E cycles (cumulative or per-stage) is not determined at the outset. It therefore remains a goal to extend each health stage for as many P/E cycles as possible, provided that retention can be ensured (i.e., so that data can be recovered successfully without incurring read failures).

As will be illustrated below, sacrificing "unnecessary" retention (e.g., between 3 months and 1 year) provides a number of opportunities to increase the expected operational lifetime of SSD 100 (e.g., 30,000 P/E cycles), even apart from the various techniques subsequently employed by Navigator module 200 in the field. As a general matter, lower stress levels (relative to the stress levels of the fixed operating parameters specified by the manufacturer of Flash Memory Chips 110) will be employed at earlier health stages before SSD 100 endures significant wear. Later health stages, on the other hand, may require even higher stress levels than those specified by the manufacturer (e.g., reflecting the cumulative wear that inevitably occurs over time, despite interim efforts by Navigator module 200 to slow down the rate of wear and extend earlier health stages).

Two key components illustrated in FIG. 4 are Plotter 410 (which relies on software models to generate "candidate" operating parameters for hardware testing, from among a massive domain of possible candidates) and Pathfinder 430 (which tests the candidates provided by Plotter 410 on actual flash memory chips). Plotter 410 and Pathfinder 430 work together in an iterative fashion to determine an appropriate number of health stages, each health stage having a cumulative or per-stage MAX P/E Count, and an optimal set of operating parameters (including one or more waypoints) associated with that health stage for subsequent use by Navigator module 200 during the operational lifetime of SSD 100.

Note that, in the context of this offline characterization phase, the term "health stage" refers to the same basic concept as employed by Navigator 200 during the operational lifetime of SSD 100, but with a slight difference. Plotter 410 and Pathfinder 430 not only determine the number of health stages and maximum length (MAX P/E Count) of each health stage during this offline characterization phase, but they also effectively "simulate" each health stage (e.g., pre-cycling blocks of flash memory to its MAX P/E Count) for the purpose of comparing candidates based upon their relative ability to satisfy retention, timing and other constraints as cumulative wear affects the flash memory over time.

In other words, it is the goal of Plotter 410 and Pathfinder 430 to test and compare candidates for "worst case" (MAX P/E Count) health stages—in order to optimize each health stage for maximal endurance with sufficient retention (effectively defining the maximum potential of each health stage). Plotter 410 and Pathfinder 430 therefore do not (in this embodiment) generate or maintain an historical record of threshold violations, or employ preventive measures during a health stage (e.g., resting a block) to extend a health stage to its maximum potential—because such preventive measures are unnecessary prior to the beginning of the operational lifetime of a flash memory device. Navigator module 200, on the other hand, monitors and addresses indicators of wear and employs these preventive measures throughout a flash memory device's operational lifetime in an effort to prolong each health stage up to its maximum potential—i.e., by addressing indicators of unexpected wear that might otherwise prevent each health stage from achieving its maximum potential.

Once the offline characterization phase is complete, Pathfinder 130 has, for each health stage, successfully tested the optimal set of operating parameters associated with that health stage on actual flash memory chips. Passing these tests required the successful recovery of data, following a standard simulation of the specified minimum retention period (3 months in this embodiment), from actual flash memory chips that had endured the maximum number of P/E cycles (MAX P/E Count) associated with that health stage.

Thus, at any point in time during the operational lifetime of SSD 100, Navigator module 200 can be assured that the operating parameters being employed during the current health stage have been pre-tested, and successfully recovered data after an elapsed 3-month retention period on actual flash memory chips that endured at least as many cumulative P/E cycles as have occurred on SSD 100 at that point in time.

As will be illustrated in greater detail below, a core attribute of the offline characterization phase is this concept of associating with each health stage a MAX P/E Count that has been "pre-tested" for successful retention. This provides Navigator module 200 with health stages that are already optimized for maximal endurance (i.e., as many cumulative P/E cycles as possible) with sufficient retention, and enables Navigator module 200 to endeavor to extend each of those health stages to its maximum potential (i.e., for as long as possible up to that MAX P/E Count) by monitoring, detecting and addressing (with interim preventive measures) indications of actual cumulative wear, despite the occurrence of unexpected wear resulting, for example, from outlier blocks and unanticipated actual usage patterns.

B. Plotter and Pathfinder Architecture

Returning to FIG. 4, Plotter 410 includes a number of key conceptual component modules that enable it to generate the "best" candidate operating parameter sets for hardware testing on Pathfinder 430—i.e., the ones most likely to satisfy the key objective of applying the least amount of stress to the flash memory for the most number of P/E cycles, while yielding the longest retention times. It should be noted at the outset that Plotter 410 faces a significant obstacle in this regard, in that the number of permutations of possible operating parameter values is enormous.

For example, while the number of operating parameter registers in a typical flash memory chip varies (e.g., from a few dozen to hundreds), we can assume in this embodiment that Flash Memory Chips 110 each contain 30 Operating Parameter Registers 116, and that they are evenly distributed (10 registers each) among read, write and erase registers. Given typical 8-bit registers, the number of possible permutations is therefore 256 to the $30^{th}$ power. To put that in perspective, 256 to the $5^{th}$ power (i.e., 5 registers) yields about 1 trillion combinations.

In this embodiment, Plotter 410 generates only the write and erase parameters of each candidate, while Pathfinder 430 eventually generates corresponding read parameters. Nevertheless, exhaustively testing a number of permutations equal to 256 to the $20^{th}$ power is still computationally prohibitive. So, Plotter 410 employs various techniques, via Candidate Generator 417 (discussed in greater detail below with reference to FIG. 6), to reduce substantially the number of potential candidates it generates before analyzing them to identify the "best" ones to submit to Pathfinder 430.

While Plotter 410 generates candidate sets of write and erase parameters for hardware testing, Pathfinder 430 generates "HW Scores" for each candidate it tests, reflecting the results of testing the candidate on actual flash chips. These HW Scores (including BER, timing and Vt window components described in greater detail below with reference to FIG. 7), are used by Plotter 410 to improve its predictive ability to generate the "best" candidates for hardware testing by Pathfinder 430 on subsequent iterations, as explained below with reference to FIG. 5.

As noted above, Plotter 410 relies on software models to generate candidates for hardware testing on Pathfinder 430. Model Builder 415, in one embodiment described in greater detail below with reference to step 520 of FIG. 5, employs neural networks and various machine-learning techniques to predict the results (i.e., the HW Scores) that any potential candidate will generate when tested by Pathfinder 430 on actual flash memory chips.

In this embodiment, Model Builder 415 generates 3 software models—one to predict "program time," one to predict "erase time" and a third to predict "success" of a read operation. These models reflect 3 key constraints on SSD 100 (i.e., to complete program and erase operations within a particular time specified by the flash chip manufacturer and the company making SSD 100, and to successfully recover data written to a block that had endured a predefined maximum number of P/E cycles, and read after a predefined retention period). In other embodiments, various other combinations of different constraints can be modeled, utilizing a variety of different machine-learning techniques.

To enable Model Builder 415 to generate each of the 3 models, the models are first "seeded" with a reasonable amount of "training data"—i.e., actual HW Scores generated by Pathfinder 430 from candidate write and erase operating parameters provided by Plotter 410. Training data and other model-related information are stored and maintained in Model DB 420, while candidate operating parameter values and other miscellaneous data are stored in General DB 425. Discovery module 414 is employed to produce this "seed" training data by generating a large number of candidates (though not necessarily the "best" candidates) to submit to Pathfinder 430 for initial hardware testing. In one embodiment, the objective of Discovery module 414 is to generate approximately 100,000 candidates for testing on Pathfinder 430 over multiple runs (which may take a few days in one embodiment of Pathfinder 430, which requires multiple hours to test approximately 4000 candidates).

To generate a large number of candidates (e.g., for 10 write parameters and 10 erase parameters), fairly basic rules are employed from which simple inferences can be drawn. For example, extreme values are generated for individual write and erase parameters (initially disregarding the effects of combinations of parameter values on one another). Given the goal of starting with relatively "low stress" write and erase parameters during early health stages, lower limits of the domain of operating parameters are initially considered. As noted above, however, program operations take less time to complete as blocks wear (e.g., due to "trapped charge"). So, the values of write parameters are selected to reflect the fact that they may actually decrease in value over time.

As initial runs are generated and submitted to Pathfinder 430 (e.g., 4000 candidates at a time), the results (HW Scores) typically indicate that specific combinations of values yield particularly poor results, while other combinations are more promising. Note that this "seed" training data is not intended to yield optimal candidates, but instead just candidates that generate realistic HW Scores that can be used to improve the predictive models. Nevertheless, to obtain meaningful HW Scores, it is useful to identify combinations of values that yield more promising candidates, and avoid combinations that yield completely unrealistic HW Scores.

For example, certain general inferences can be drawn from these initial results, and from prior experience in testing flash memory chips with a vast range of different operating parameter values. For example, high BER rates may result from particular combinations of low parameter values, while high values at the other extreme may yield lower BER rates. In any event, though far from perfect, these 100,000 candidates provide useful training data to enable initial generation of the 3 models, as explained in greater detail below with reference to step 520 of FIG. 5.

Figure 6:
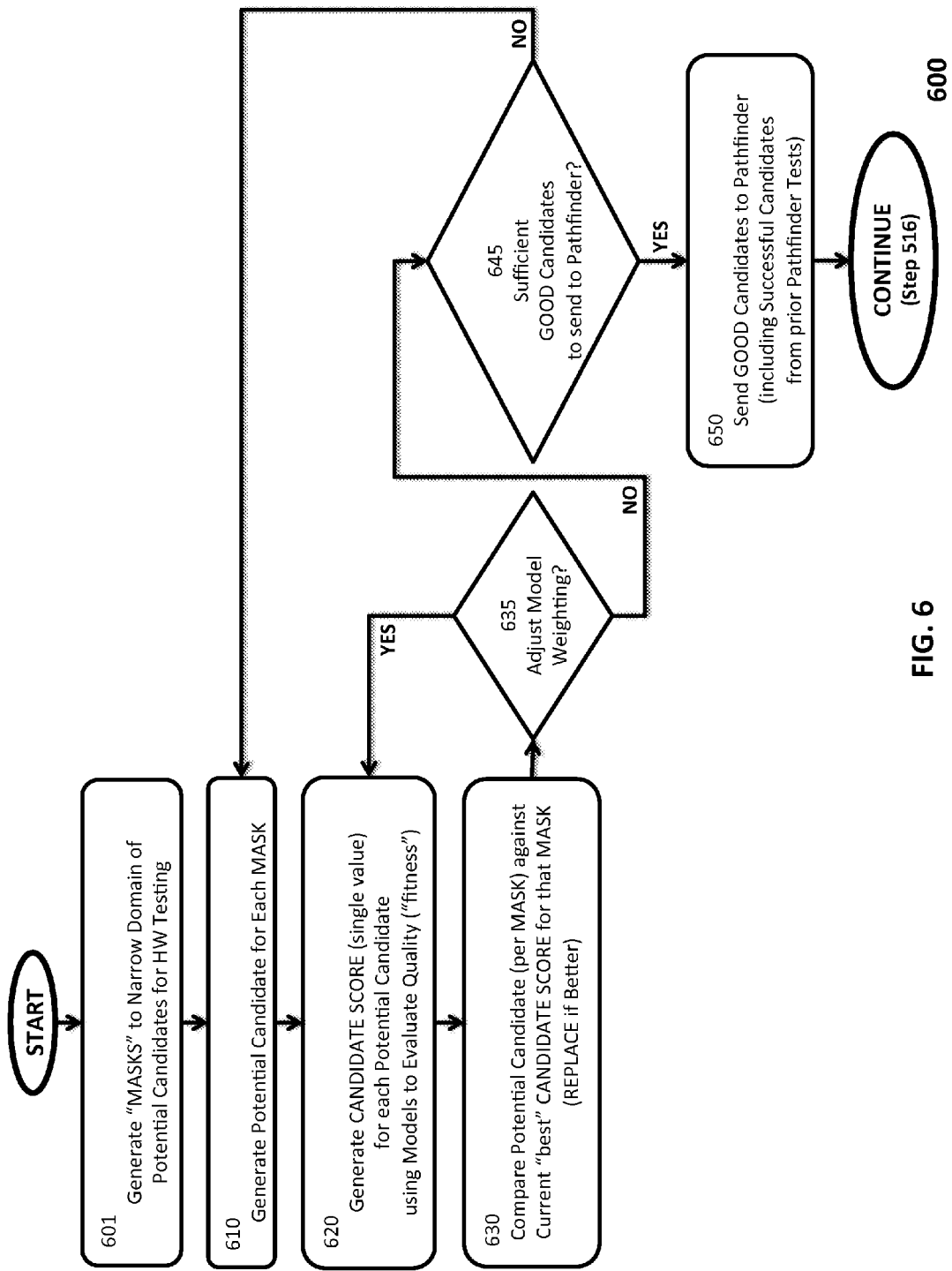
FIG. 6 is a more detailed flowchart illustrating one embodiment of the dynamic operation of the candidate-generation process performed by the Plotter component of the present invention in which candidate sets of operating parameters are generated for flash memory hardware testing on the Pathfinder component of the present invention.

Further refinement of the models, by Model Builder 415, will occur following iterations of hardware testing in Pathfinder 430 of the "good" candidates generated by Candidate Generator 417. The candidate-generation process, discussed in greater detail below with reference to FIG. 6, is based on the concept that significant limitations must be imposed to reduce the immense domain of possible values of 10 write and 10 erase operating parameters to a manageable number. In one embodiment, "masks" are employed to limit the range of values of any single operating parameter. Instead of a relatively large range of 0-255, a "high" (H) or "low" (L) mask is employed to limit that range to a low (L) value (e.g., a random number from 0-127) or a high (H) value (e.g., 128-255). For example, for 2 registers, instead of "255 squared" permutations, only 4 mask permutations would be generated (i.e., H-H, H-L, L-H and L-L). The process by which potential candidates are generated from these masks, and then compared with one another to yield a set of "good" candidates for Pathfinder 430 to test in hardware, is explained in greater detail below with reference to the flowchart in FIG. 6.

Health Stage Analyzer 419 manages the interaction and iterations with Pathfinder 430. In one embodiment, Health Stage Analyzer 419 manages the process for determining the number of health stages, as well as the cumulative MAX P/E Count (or, in another embodiment, the per-stage MAX P/E Count) associated with each health stage. For example, assuming an expected lifetime of 30,000 P/E cycles, Health Stage Analyzer 419 initially predicts 6 health stages of 5000 P/E cycles each. However, as noted above, a key objective for each health stage is to complete the largest possible number of P/E cycles while still ensuring retention is satisfied. So, as will be explained in greater detail below with reference to step 520 of FIG. 5, multiple iterations with Pathfinder 430 are performed, at different P/E-cycle durations, until the highest-duration health stage that still satisfies retention is identified.

Upon determining the maximum length of the first health stage (e.g., 5500 P/E cycles), and a set of candidates for hardware testing (e.g., 4000 sets of 10 write and 10 erase parameters, each set to be tested once), this information is passed to Pathfinder 430 to run these hardware tests and generate HW Scores for each of the 4000 candidates. In one embodiment, Health Stage Analyzer 419 instructs Candidate Generator 417, in subsequent iterations, to generate and submit fewer candidates for more extensive hardware testing as Plotter 410 refines its selection of "good" candidates. Note that repeating a hardware test may not yield identical results—for a variety of different reasons including, for example, manufacturing variations among different blocks of flash memory.

In a subsequent iteration, 1000 candidates are each tested 4 times, then 400 candidates are each tested 10 times, and so forth until an optimal candidate for each health stage is determined. As will be explained in greater detail below with reference to FIG. 6, Candidate Generator 417 (in one embodiment), in addition to generating and selecting new "good" candidates for subsequent iterations of hardware testing by Pathfinder 430, also retains "very good" candidates from prior iterations—e.g., those with HW Scores exceeding predefined thresholds.

This iterative process continues, as illustrated in greater detail with respect to FIG. 5 below, until it yields the number of health stages, the maximum length (MAX P/E Count) of each health stage, and an optimal set of operating parameters (and corresponding waypoints) associated with each health stage.

While Pathfinder 430 is illustrated as a collection of key conceptual software components (in this embodiment), it communicates with actual flash memory hardware to manage the testing process. For example, standard Flash Chip Test Heads 445 (e.g., 10 BGA or TSOP sockets, each used to surface-mount an actual flash memory chip) are employed in connection with limited-purpose Flash Test Controllers 440 to facilitate testing involving read, write and erase operations on the flash memory chips. In one embodiment, one Flash Test Controller 440 is provided for each Flash Chip Test Head 445. Each Flash Test Controller 440 includes basic functionality similar to Channel Interface 125, but with software enabling special-purpose communications with Pathfinder 430 as described below.

Though not shown in FIG. 4, an AFT interface (as noted above) is optionally included between each Flash Test Controller 440 and each Flash Chip Test Head 445 (e.g., if required by the manufacturer of the flash memory chips). In another embodiment, a single AFT interface is employed for use by all of the Flash Test Controllers 440 and Flash Chip Test Heads 445. In any event, this AFT interface enables modification of the operating parameter registers of each flash memory chip without revealing or requiring knowledge of the flash manufacturer's proprietary information.

Pathfinder 430 generates HW Tests (including, for example, candidate sets of operating parameters and locations for various read, write and/or erase operations), which it submits to each Flash Test Controller 440 (implemented in this embodiment on a standard single-board computer). As will be discussed in greater detail with reference to FIG. 7, Pattern Generator 432 is employed to generate various "test patterns" to be written into the flash memory and retrieved after a predefined retention period, as well as various "cycling patterns" used to pre-cycle the flash memory (e.g., to artificially create cumulative wear by performing 8000 P/E cycles on one or more blocks of flash memory, as might occur in the field during one or more health stages). Scheduler 439 is employed to schedule these tests, determining for example which blocks of flash memory are utilized by which candidate sets of operating parameters.

As noted above, the performance capabilities of Pathfinder 430 are limited by the number of flash memory chips employed, and the speed of the Flash Test Controllers 440 in implementing a particular test. In this embodiment, running a single test for 4000 candidates requires many hours to complete (as, for example, would 100 tests for 40 candidates). Each test is run in parallel, requiring many hours of iterations of scheduled writes (and then pre-retention and post-retention reads) across each of the 4 LUNs in the 10 flash memory chips to complete a single test on 4000 candidates—not to mention the simulated retention time, which itself may require multiple days.

Flash Test Controllers 440 submit each test to their respective flash memory chips installed on corresponding Flash Chip Test Heads 445, and receive and process the raw data to extract, for example, BER and timing information resulting from the read, write and erase operations performed on the flash memory chips. These results are returned to Pathfinder 430 for analysis. Note that, while ECC data is employed in writing data into the flash memory, no error correction is performed by Flash Test Controllers 440, as the "test patterns" are employed solely to enable Pathfinder 430 to compute HW Scores that Plotter 410 can use to compare candidates based upon their performance on actual flash memory chips.

These results are collected by Data Collection module 434, which processes them for use by Vt Window Generator 435 and, ultimately, for delivery back to Plotter 410 in the form of HW Scores. For example, while all raw BER and timing information (e.g., program time and erase time) is delivered directly back to Plotter 410 (in one embodiment), the program time and erase time components of the HW Scores also reflect the results of multiple hardware tests that may have been performed. In one embodiment, two values each are returned for program time and erase time—one reflecting the average program time or erase time among multiple tests, and the second reflecting the percentage of tests "passed" (i.e., satisfying the manufacturer's program time or erase time constraint). In another embodiment, peak program times and erase times are also returned, reflecting "worst case" scenarios.

As will be discussed in greater detail below with reference to FIG. 7, Vt Window Generator 435 utilizes raw BER data to generate the "Vt window" component of the HW Score for each candidate. In essence, the VT window component reflects a range of voltages (corresponding to read parameters) in which a read operation successfully recovered data (i.e., all sectors had no more than 40 bit errors for data written with 40-bit ECC). In this embodiment, multiple read operations are performed (across all pages within a block of flash memory) with different sets of read parameters in order to generate this range. In general, a wide range is preferable, in that it indicates that multiple different sets of read parameters will successfully recover data. In one embodiment, two values are returned for the Vt window component of the HW Score for each candidate—one reflecting the size of the smallest successful range, and the other reflecting the percentage of hardware tests that successfully recovered data.

Finally, Waypoint Generator 437 is employed by Pathfinder 430 (for a given health stage) only after a sufficient number of iterations with Plotter 410 have occurred to narrow down the domain of potentially "optimal" candidates (for that health stage) to a small number—e.g., 5 in one embodiment. In other words, only after Plotter 410 submits 5 remaining candidates to Pathfinder 430 for "final" hardware testing (each to be tested 800 times in this embodiment) will Pathfinder 430 rely upon Waypoint Generator 437 to generate waypoints (multiple sets of alternative read parameters) for each of these 5 candidates, and conduct one final hardware test to enable Plotter 410 to compare them and select the single "optimal" candidate (with its set of waypoints) for a particular health stage.

C. High-Level Dynamic Interaction between Plotter and Pathfinder

Figure 5:
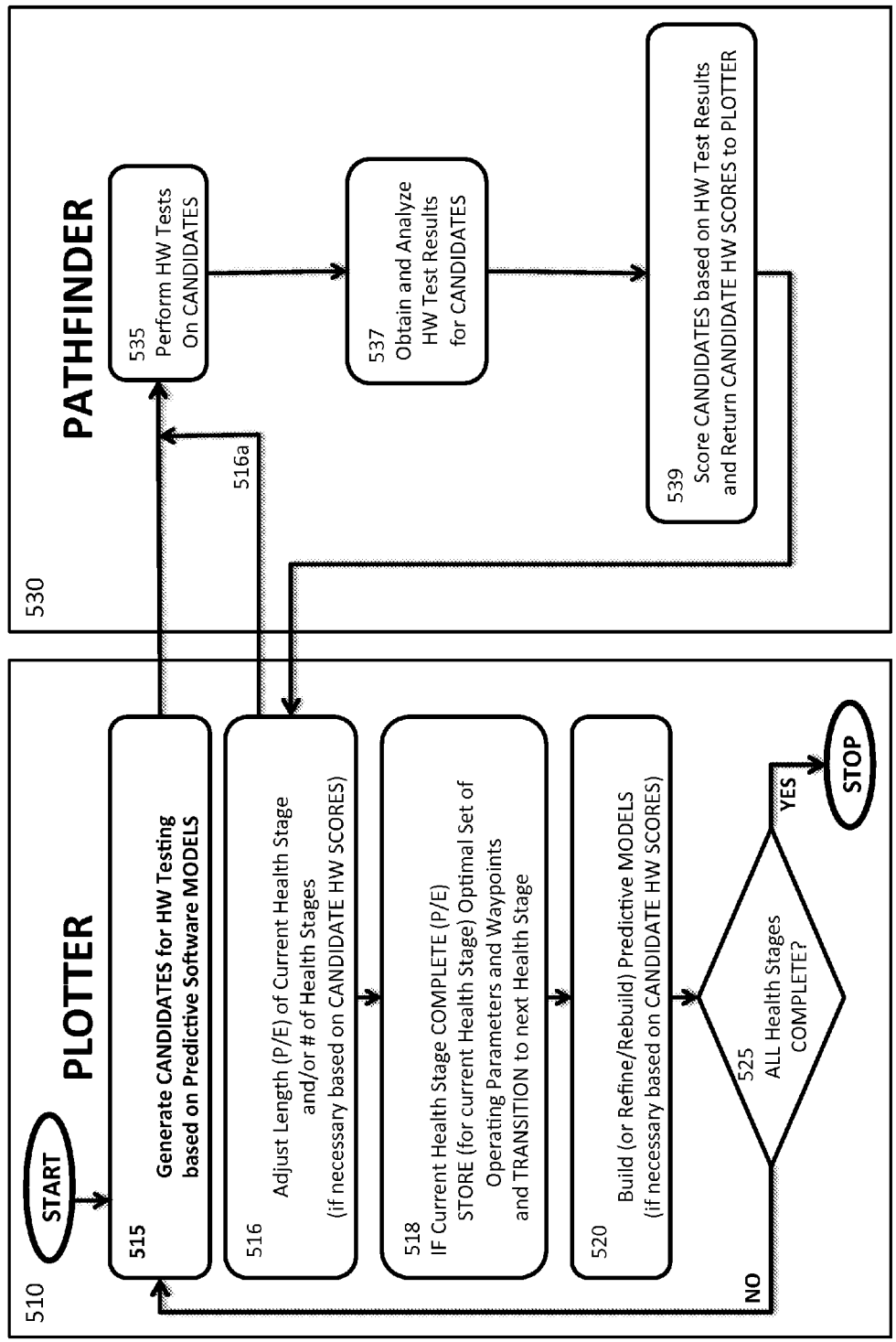
FIG. 5 is a high-level flowchart illustrating one embodiment of the dynamic operation of, and interaction between, the Plotter and Pathfinder components of the present invention.

Turning to FIG. 5, flowchart 500 illustrates the high-level interaction between Plotter 510 and Pathfinder 530 that facilitates the determination of the number and maximum length (MAX P/E Count) of health stages, as well as optimal sets of operating parameters (including waypoints) associated with each health stage. In key step 515 (discussed in greater detail below with reference to FIG. 6), Plotter 510 generates candidates (sets of write and erase parameters) for hardware testing on Pathfinder 530.

As will be explained below, step 515 generates candidates using the 3 models after those models have been refined based upon HW Scores from Pathfinder's prior iteration (see step 520 below for an explanation of the initial generation and iterative refinement of these 3 models). As noted above, in addition to regenerating new candidates, step 515 retains (in one embodiment) certain "very good" candidates from prior iterations for continued hardware testing by Pathfinder 530.

Initially, as noted above, Plotter 510 relies on Initialization module 412 and Discovery module 414 to generate a large number of candidates for hardware testing on Pathfinder 530 for the purpose of generating "seed" data to facilitate the building of 3 predictive software models by Model Builder 415. But once the initial models are built (and rebuilt upon each iteration with Pathfinder 530), Candidate Generator 417 relies on those "up-to-date" models, to generate a new set of candidates for further hardware testing.

While step 515 encompasses both the initial generation of "seed" candidates and the subsequent generation of candidates (for ultimate selection of an "optimal" candidate per health stage), FIG. 6 is focused on the latter. In any event, upon receiving a set of candidates, along with a MAX P/E count, designated retention time and number of tests to perform, Pathfinder 530 performs the specified number of tests on each candidate in step 535, obtains and analyzes the results of those tests in step 537, and generates HW Scores for each candidate in step 539, which are then returned to Plotter 510. Each of these steps is discussed in greater detail below with reference to FIG. 7.

As noted above, at the beginning of each health stage, Plotter 510 determines, in step 516, the appropriate maximum length (i.e., MAX P/E Count) of that health stage. In one embodiment, that MAX P/E Count is a cumulative P/E count encompassing all prior health stages. In another embodiment, it is a per-stage P/E count applicable only to the current health stage (and independent of the cumulative P/E count from all prior health stages). In either case, as alluded to above, the MAX P/E Count ultimately represents the total number of P/E cycles for which the "optimal" candidate will be "pre-tested" in hardware (by Pathfinder 530) for retention, as well as timing and other design constraints.

Plotter 510 initially relies upon Health Stage Analyzer 419 to predict the number and maximum length of health stages in light of the constraints specified by the flash chip manufacturer and the company making SSD 100. For example, assuming an expected lifetime of 30,000 P/E cycles, Health Stage Analyzer 419 initially predicts 6 health stages of 5000 P/E cycles each. But, at this point, Plotter 510 does not yet know the appropriate MAX P/E Count to associate with this health stage—e.g., the largest number of P/E cycles that will still ensure retention is satisfied.

So, it generates multiple iterations through Pathfinder 530 (see path 516a) using the current set of candidates, increasing the number of P/E cycles on each iteration until retention can no longer be satisfied. For example, it may begin with 2500 P/E cycles, which might yield HW Scores indicating that a high percentage of candidates satisfied retention (as well as timing and other relevant constraints) on a high percentage of tests (based on internal thresholds). The same may be true, but to a lesser extent, for iterations of 3500 P/E cycles and 4000 P/E cycles. But, eventually (e.g., 6000 P/E cycles), the HW Scores will indicate that an insufficient percentage of candidates satisfies these constraints (based on those internal thresholds). The MAX P/E Count will then be deemed equal to the number of P/E cycles tested on the most recent successful iteration (e.g., 5500 P/E cycles).

This process in step 516 is repeated at the beginning of each subsequent health stage in order to determine the appropriate MAX P/E Count (cumulative or per-stage) to associate with that health stage. Eventually, during later health stages, Health Stage Analyzer 419 determines that no additional health stages are warranted. For example, in one embodiment, a next health stage is tested, but cannot yield a sufficient percentage of candidates that satisfy the relevant constraints, even for a small number of additional P/E cycles (e.g., an internal threshold of 500). In other words, due to the cumulative wear from prior health stages, the inevitable end of the operational lifetime of the flash memory is approaching, rendering that next health stage pointless.

For example, assume the cumulative MAX P/E Count is at 35,000 P/E cycles after seven health stages. Note that the MAX P/E Count and current number of health stages may exceed, or fall short of, the initial specified "goals"—e.g., 30,000 P/E cycles and six health stages. But, in one embodiment, the MAX P/E Count is unlikely to exceed its initial goal because the frequency of testing P/E cycles in Pathfinder 530 (as discussed below with reference to FIG. 7) is determined based upon that initial goal and expected usage. In any event, at the beginning of the eighth health stage, Health Stage Analyzer 419 initiates an iteration through Pathfinder 530 for an additional 500 P/E cycles, and the HW Scores are insufficient. In that case, Health Stage Analyzer 419 may conclude that no additional health stages are warranted, and that the "final" expected cumulative P/E count is 35,000 P/E cycles over seven health stages (ultimately ending flowchart 500 in step 525).

Once the MAX P/E Count is determined in step 516 for the current health stage, Health Stage Analyzer 419 determines whether the current health stage has been completed in step 518. Initially, of course, that will not be the case. But, as noted above, in one embodiment, Health Stage Analyzer 419 instructs Candidate Generator 417 initially to generate 4000 "good" candidates for a single hardware test by Pathfinder 530. In subsequent iterations, it will refine that number to 1000 candidates each tested 4 times, then 400 candidates each tested 10 times, etc. Eventually, in this embodiment, that number will be refined to 5 candidates each tested 800 times.

As will be explained in greater detail below with reference to FIG. 7, Pathfinder 530 will then generate waypoints for all 5 candidates and perform one final test. The HW Scores from that final test will enable Health Stage Analyzer 419 to determine the "optimal" candidate for the current health stage. In that event, step 518 stores the optimal candidate (with waypoints) in General DB 425 and transitions to the next health stage.

In step 520, the most recent HW Scores are utilized to refine and (in one embodiment) rebuild the 3 models. When the models have been refined and/or rebuilt, the offline characterization phase will terminate if all health stages have been completed (per step 525), as noted above. Otherwise, control will return to Candidate Generator 417 to generate, in step 515, the next set of candidates for hardware testing by Pathfinder 530 (whether at the beginning of a next health stage or in the middle of the current health stage).

Turning to step 520, the 3 predictive models are either generated for the first time (based upon the "seed" HW Scores generated by Pathfinder 530 via Discovery module 414 as discussed above) or refined and/or rebuilt based upon additional "training data" (also HW Scores) from the prior iteration with Pathfinder 530. In either scenario, it is important to understand how standard neural network and other machine-learning techniques are employed to enable these 3 models to predict, with increasing accuracy, the results (i.e., the HW Scores) that any potential candidate will generate when tested by Pathfinder 530 on actual flash memory chips. It is this predictive ability that enables Plotter 510 to generate "better and better" candidates (in step 515) for hardware testing by Pathfinder 530 until it eventually (typically after multiple iterations) determines an "optimal" candidate for each health stage.

As is well known in the art, a non-linear system that generates "predictable" actual sets of outputs from a domain of input sets can be modeled in software by creating and refining a non-linear function that approximates an output set given any input set within the domain. By refining this function automatically over time, based upon "training data" (actual sample input and output sets from the non-linear system) received during each iteration, the function effectively "learns" to predict with increasing accuracy the actual output set that the non-linear system will produce given any input set within the domain.

In particular, as the model receives more training data, adaptive weights applied to each input parameter of an input set are adjusted, and the weighted parameters are combined in different ways, to yield a refined function that is gradually "trained" (or "learns over time") to better predict actual output sets. In other words, generating this refined function (i.e., rebuilding the model) involves an iterative feedback loop. During each iteration, the model's results are compared against the actual training data results, and the function is then refined for the next iteration. Eventually, an equilibrium is reached in which the results are no longer improving sufficiently, and this refinement process terminates (until more training data arrives). As will be apparent to one skilled in the art, numerous well-known "function-fitting algorithms" can be employed to determine automatically how to adjust the adaptive weights, as well as how to combine the weighted parameters, to better predict actual output sets. Moreover, various combinations of these and other machine-learning techniques can be employed in the context of virtually any design constraints or performance characteristics of flash memory without departing from the spirit of the present invention.

In one embodiment, these concepts are applied to 3 key design constraints imposed by SSD 100 and its Flash Memory Chips 110 (to develop and refine/rebuild 3 corresponding software models)—i.e., (1) "program time" (completion of a write operation within "x" ms), (2) "erase time" (completion of an erase operation within "y" ms) and (3) "success" of a read operation. As noted above, a "successful" read operation in this embodiment requires that no sectors have more than 40 bit errors (given 40-bit ECC) when reading data written to a block that had endured a predefined maximum number of P/E cycles, and was read after a predefined retention period.

In another embodiment, rather than simply reflecting success as a binary (yes or no) result of a single successful read, it instead reflects a percentage of successful reads over multiple Pathfinder 530 hardware tests (e.g., 0.9 reflecting that 9 of 10 hardware tests passed successfully). In yet another embodiment, a Vt window component is employed. As will be explained in greater detail below with reference to FIG. 7, Pathfinder 530 generates for each candidate a Vt window component that not only reflects the percentage of successful tests, but defines a successful test by the existence of a window or range of read parameter values (representing read voltages) that resulted in successful read operations across all of the pages within each tested block of flash memory. As discussed below, in one embodiment, each candidate is tested on multiple blocks across multiple LUNs and chips (both pre-retention and post-retention), thereby facilitating a comparison of candidates that takes into account manufacturing variations and other variables likely to be encountered in the field.

In any event, these 3 software models are generated (and refined/rebuilt upon receiving each subsequent iteration of "training data" from Pathfinder 530) in step 520. For example, in the context of a flash memory chip, writing a particular test pattern to its flash memory in accordance with its operating parameters (in this case, write parameters) takes a certain amount of time to complete—"program time" (also referred to as "write time"). In this context, the training data consists of candidate sets of operating parameters (e.g., input sets of 10 write parameter values) and a single program time (output) resulting from the write operation. The "program time" software model weights each of the 10 write parameters and combines the weighted parameters to generate a non-linear function that predicts a program time given any input set of 10 write parameter values (e.g., each value from 0-255 representing the domain of values stored in an 8-bit register).

The "erase time" software model follows a similar methodology, but employing the 10 erase parameters. The "success" software model is slightly more complex, in one embodiment, in that both the write and erase parameters are employed as inputs to the function that predicts the success of the read operation (whether defined by Pathfinder 530 as a single binary value, a percentage or a Vt window component as discussed above). As noted above, Pathfinder 530 iteratively generates HW Scores for each candidate it tests, which are used as "training data" to refine each of these 3 models in step 520.

In one embodiment, each of these 3 software models is completely regenerated "from scratch" during each iteration (i.e., using the cumulative training data generated by Pathfinder 530 over all previous iterations), while in another embodiment the existing software models are merely "refined" to reflect the new training data received during the current iteration. As noted above, once the software models are "up to date" for a given iteration, and all health stages have not been completed (per step 525), control continues to step 515 where Plotter 510 generates candidates for the next iteration with Pathfinder 530. This candidate-generation step 515 will now be discussed in detail with reference to FIG. 6.

D. Candidate Generation by Plotter

As noted above, in one embodiment, Plotter 510 retains certain "very good" candidates from prior iterations with Pathfinder 530 to be used for subsequent iterations of refined hardware testing. In this embodiment, an internal threshold HW Score is employed to identify and provide such candidates to Pathfinder (as part of step 650 below). In other embodiments, a threshold percentage (e.g., highest 10% of HW Scores) is employed. Apart from these candidates, an entirely new set of candidates is generated by Candidate Generator 417, as shown in flowchart 600 of FIG. 6.

As also noted above, the key constraint on this candidate-generation process is the sheer number of permutations of write and erase parameter values (256 to the $20^{th}$ power in this embodiment, assuming 8-bit register values and 10 write and 10 erase parameters), which renders any exhaustive approach computationally prohibitive. Note also that read parameters (and waypoints) are determined by Pathfinder 530, but not until the final iteration when the number of candidates has been substantially reduced (e.g., to 5 candidates in this embodiment).

As briefly discussed above, the primary approach to substantially reducing the number of permutations involves the use of "masks" in step 601. In one embodiment, "high" (H) and "low" (L) masks are employed to limit the range of each write and erase operating parameter value to either a low value (0-127) or a high value (128-255), as opposed to a range of 256 values. In other words, instead of a massive number of permutations of 255 to the 20th power, the number of "mask" permutations is reduced to 2 to the $20^{th}$ power or approximately 1 million masks in this embodiment. For example, one mask consists of all 20 high values ("H-H-H . . . H"), while another mask consists of all 20 low values ("L-L-L . . . L"), and so forth.

The process continues in step 610 in which Candidate Generator 417 generates one "potential candidate" for each mask—i.e., by generating a random number within the range of each low or high mask component in each mask. In other words, each distinct "L" component will be replaced by a random number between 0-127, while each distinct "H" component will be replaced by a random number between 128-255. Thus, as a result of step 610, Candidate Generator 417 generates approximately one million potential candidates, each having a distinct random value associated with each of the 10 write and 10 erase parameters represented by its associated mask.

Note that, in the first iteration with Pathfinder 530 in this embodiment, the goal is to generate 4000 "good" candidates, where a "good" candidate, as will be explained below, is one having a "Candidate Score" exceeding an internal threshold. None of these approximately one million "potential candidates" has yet been selected for submission to Pathfinder 530. In the embodiment illustrated in FIG. 6, the 4000 will be relatively evenly distributed among the masks, in that a "winner" for each mask will be selected, and then the top 4000 Candidate Scores of those approximately one million winners will be submitted to Pathfinder 530. In another embodiment, the top 4000 candidates with the highest Candidate Scores will be selected, without regard to their distribution among the approximately one million masks.

In any event, it should be noted that, at this point, each mask has only one associated potential candidate. Turning to step 620, each potential candidate is "scored" to enable potential candidates to be compared to one another on a qualitative basis—i.e., to determine which potential candidate is most likely to satisfy the 3 constraints (program time, erase time and success) when tested on hardware by Pathfinder 530. In other words, at the end of step 620, each of the approximately one million potential candidates will have an associated score, which will be the current highest score associated with its mask (because each mask has only one associated potential candidate at this point).

In one embodiment, this scoring involves the generation of a single "Candidate Score" value. Initially, 3 "Raw Model Scores" are generated for each potential candidate by substituting its 20 parameter values into the function for each model. For example, the "program time" model function will have a single weighted parameter associated with each write parameter. If the weighted parameter in the function is "2×w1" and a potential candidate's w1 write parameter equals 135, then the weighted parameter in the function will equal 270. Note, however, that each model function is intended (per step 520 in FIG. 5) to predict (i.e., yield output values that are as close as possible to) the actual HW Score that Pathfinder 530 would generate for that potential candidate (e.g., an actual "program time").

Once Candidate Generator 417 generates 3 Raw Model Scores for each potential candidate (one from each model function), then it translates each of these 3 Raw Model Scores (by employing a well-known "fitness function") into a corresponding "Fitness Score" that reflects the extent to which that potential candidate has satisfied the constraint associated with its model. For example, given a "program time" constraint of less than 2 ms, if a first potential candidate's "program time" function yields a Raw Model Score of 1.9, and a second potential candidate's "program time" function yields a Raw Model Score of 1.8, the first potential candidate may receive a Fitness Score (for this model) of 0.7, while the second candidate may receive a Fitness Score of 0.8, reflecting the fact that, while both candidates are predicted to satisfy the "program time" constraint, the second candidate is more likely to do so, and thus receives a higher Fitness Score. In another embodiment, any Raw Model Score that satisfies the constraint will yield a Fitness Score of 1, with lower values reserved for Raw Model Scores that do not satisfy the constraint, reflecting lower probabilities that a potential candidate will satisfy the constraint. As will be apparent to one skilled in the art, various different "fitness functions" may be employed without departing from the spirit of the present invention.

Having now generated 3 Fitness Scores for each potential candidate, Candidate Generator 417 employs a "selection function" to generate a single Candidate Score from these 3 Fitness Scores. In one embodiment, the selection function involves weighting each of the 3 Fitness Scores (i.e., each of the 3 constraints) by its relative importance and then combining them together (e.g., summing the weighted scores in one embodiment). For example, consider a scenario in which many potential candidates satisfy the "program time" and "erase time" constraints, but few if any satisfy the "success" constraint. Such a scenario may suggest that the "success" Fitness Score is not weighted sufficiently high. As will be discussed below with reference to step 635, these "model weights" (corresponding to the relative importance of each of the 3 models) may be adjusted automatically over time.

As a result of employing this selection function, Candidate Generator 417 has now generated a single qualitative Candidate Score for each potential candidate, reflecting the relative ability of each potential candidate to satisfy all 3 constraints. It should be noted that, at this point, each mask still has only one associated potential candidate (and corresponding Candidate Score).

Turning to step 630, Candidate Generator 417 compares, for each mask, the current Candidate Score (generated in Step 620) with the current highest Candidate Score associated with that mask thus far ("current mask leader"). If the current Candidate Score is higher than the current mask leader, then that Candidate Score (and its corresponding potential candidate) replaces (and becomes) the current mask leader. During the first iteration, the current potential candidate will automatically be the current mask leader. But, as will be illustrated below, subsequent potential candidates will be generated and scored for each mask, and may replace the current mask leader.

In one embodiment, steps 610, 620 and 630 are performed in parallel for each mask. In other words, assuming approximately one million masks, a potential candidate is generated in parallel for each of those approximately one million masks in step 610, and then approximately one million Candidate Scores are generated in parallel (one for each mask) in step 620, and finally, in step 630, approximately one million comparisons are performed in parallel (one for each mask)—i.e., between the Candidate Score (of the current potential candidate) generated in step 620, and the current mask leader.

In one embodiment, after each per-mask comparison in step 630, Candidate Generator 417 determines in step 635 whether the model weights should be adjusted. In another embodiment, this determination is performed periodically (e.g., after every 50 per-mask comparisons). In yet another embodiment, step 635 is only performed once after an initial threshold number (e.g., 100) of per-mask comparisons have been performed. Regardless of how this accuracy/performance tradeoff is resolved in any given implementation, the goal remains the same—i.e., to generate a sufficient number of "good" candidates for submission to Pathfinder 530. As a general matter, if the "quality" (i.e., Candidate Scores of the mask leaders) is not improving as more iterations are performed, then the model weights may need to be adjusted.

For example, in one embodiment, an internal threshold function is employed to indicate an expected number of "good" candidates relative to the elapsed number of iterations (through steps 610, 620 and 630). While the initial expected number may be quite low, it will increase over time as more iterations occur, and then perhaps level out after a large number of iterations. In another embodiment, the current health stage will be a parameter of the threshold function. In other words, as the health stages progress, the effective threshold of "good" candidates will increase, reflecting the fact that the cumulative wear of the flash memory over time requires a higher standard for a "good" candidate.

In any event, if a model weight adjustment is deemed necessary in step 635, then Candidate Generator 417 repeats step 620 by adjusting the model weights and recalculating the Candidate Scores, at which point new comparisons are performed in step 630. Otherwise, Candidate Generator 417 continues to step 645 to determine whether a sufficient number of "good" candidates has been generated. In one embodiment, an internal Candidate Score threshold is employed to make that determination.

For example, after the initial iteration, it may be the case that none of the approximately one million current mask leaders satisfies this internal threshold. Eventually, however, when at least 4000 "good" candidates are identified (among the approximately one million current mask leaders), Candidate Generator 417 proceeds to step 650 and submits the top 4000 of those "good" candidates to Pathfinder 530 for hardware testing, along with any "very good" candidates from prior Pathfinder 530 iterations. As noted above, Pathfinder 530 will receive, in addition to the candidates (write and erase parameters) themselves, the number of tests to be performed, the MAX P/E Count for the current health stage and the relevant retention, timing and other constraints. As also noted above, the goal in subsequent iterations with Pathfinder 530 may be a fewer number of "good" candidates (e.g., 1000) submitted for more extensive hardware testing (e.g., 4 tests each).

If, however, Candidate Generator 417 determines in step 645 that a sufficient number of "good" candidates has not yet been generated, then it returns to step 610 to generate another set of approximately one million potential candidates per mask. In other words, it generates another random number within the range of each low or high mask component in each mask, and then repeats steps 620 and 630 as discussed above with respect to the "new" potential candidate corresponding to each mask.

It should be noted, as alluded to above, that the failure to generate a sufficient number of "good" candidates may simply be due to the fact that more iterations (through steps 610, 620 and 630) are required. At some point, however, Candidate Generator 417 may determine, in step 635 as discussed above, that the problem rests with the model weights, and that they require adjustment. In other embodiments, the number of masks is reduced, for example, by removing the worst 1% of masks (i.e., those that are generating the fewest "good" candidates).

Once step 650 has been completed, and Pathfinder 530 completes the next iteration of hardware testing and returns the Hardware Scores for each tested candidate to Plotter 510, control returns to step 516 as discussed above.

E. Hardware Testing of Plotter Candidates by Pathfinder

Figure 7:
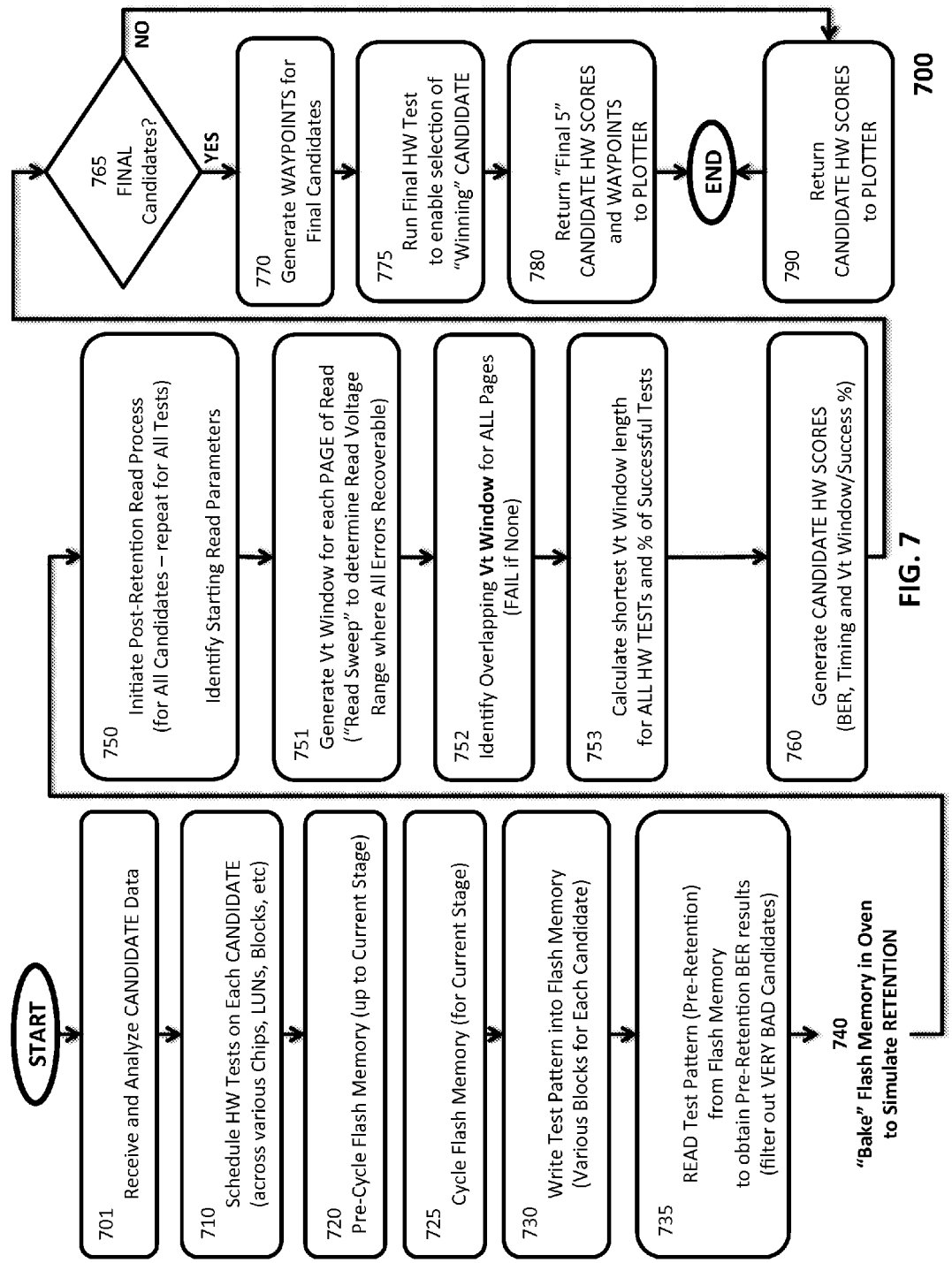
FIG. 7 is a more detailed flowchart illustrating one embodiment of the dynamic operation of the Pathfinder component of the present invention in which candidate sets of operating parameters are iteratively tested and scored on flash memory hardware for evaluation by the Plotter component of the present invention.

Turning to FIG. 7, flowchart 700 illustrates one embodiment of the dynamic process by which Pathfinder 530 performs iterative hardware tests on the candidates (each having 10 write and 10 erase parameters in this embodiment) provided by Plotter 510. As discussed above, Pathfinder 530 generates HW Scores for each candidate reflecting its performance on those hardware tests, which Plotter 510 uses to update and improve its predictive software models and generate a new set of candidates for hardware testing. This iterative process continues, as explained above with reference to FIGS. 4-6, until an optimal set of candidates is selected for each health stage (including waypoints determined by Pathfinder 530 toward the end of the iterative process for each health stage).

During each iteration across multiple health stages, Pathfinder 530 receives from Plotter 510, in step 701, the set of candidates to be tested in hardware (each having 10 write and 10 erase parameters), along with the number of tests to perform, the MAX P/E Count for the current health stage, and the relevant retention, timing and other constraints.

Scheduler 439 determines, in step 710 (for each test), the particular locations within the flash memory chips that will be utilized for each candidate, and schedules when particular test patterns are written to or read from those locations (as well as when particular blocks of memory are erased or "cycled" to "simulate" a P/E cycle). For example, different blocks will be utilized across multiple iterations within and across health stages, as well as for different tests. Over the course of multiple tests for a given candidate (and for each test, in one embodiment), data will be written into multiple different blocks of flash memory across multiple LUNs and even multiple flash memory chips (e.g., to avoid undue influence of outlier blocks).

Moreover, it is well known that certain areas of flash memory chips (e.g., the last page of each block) are known to be "weak"—i.e., more likely to generate read errors. Similarly, certain test patterns in particular locations ("challenge data") are also known to be more difficult to recover. In any event, as will be apparent from the following steps of flowchart 700, Scheduler 439 is responsible for ensuring that the various read, write and erase operations are performed on the appropriate locations and at the appropriate times to facilitate the testing of 4000 candidates across 10 flash memory chips.

It should be noted that, in one embodiment, Pathfinder 530 simulates a particular use case (e.g., usage patterns for a USB thumb drive, Enterprise SSD, etc.) during this offline characterization phase by correlating the frequency of P/E cycles it performs (e.g., during steps 720 and 725 discussed below) to the expected frequency of P/E cycles for that use case (in some cases employing standard accelerated temperature-testing techniques, similar to those used for retention testing discussed below with reference to step 740). Moreover, because different operating parameters are employed for different candidates, Scheduler 439 manages the timing of the updating of the 40 LUNS (with the operating parameters associated with the relevant candidates) so as to perform as many operations in parallel as possible to maximize performance while maintaining the desired frequency of P/E cycles.

In step 720, Pathfinder 530 produces cumulative wear for the prior health stages (if any) by pre-cycling the relevant blocks (determined in step 710 above) for the number of cycles corresponding to each prior health stage. For example, during the first health stage, no pre-cycling is necessary. During the second health stage, the write and erase parameters of the optimal candidate from the first health stage are employed to pre-cycle the relevant blocks for a number of P/E cycles equal to the MAX P/E Count from the first health stage. During the third health stage, the same pre-cycling as was done for the second health stage is performed, and additional pre-cycling is done using the write and erase parameters of the optimal candidate from the second health stage for a number of P/E cycles equal to the MAX P/E Count from the second health stage. And so on for each additional health stage.

In step 725, Pathfinder 530 now produces cumulative wear for the current health stage by cycling the relevant blocks for the number of cycles corresponding to the current health stage (i.e., to the maximum potential of this current health stage). As explained above with reference to step 516 of FIG. 5, this step is also performed while Health Stage Analyzer 419 is attempting to determine the MAX P/E Count for the current health stage. In either event, a number of P/E cycles is specified in step 701 and used for this cycling process. The write and erase parameters of each candidate are employed (with respect to their relevant blocks) for this cycling process.

Pattern Generator 432 employs various different standard "cycling patterns" to be written during steps 720 and 725. These cycling patterns are typically supplied by the manufacturer of the flash memory chips for testing purposes. In one embodiment, a different cycling pattern is used for each P/E cycle. In other words, Pathfinder 530 writes one cycling pattern to the relevant blocks, erases the blocks, and then repeats that P/E cycle with a different cycling pattern for each one of the specified number of P/E cycles.

Once the relevant blocks have been cycled in steps 720 and 725 to generate the specified cumulative wear, they are erased once more, in step 730, using the relevant candidate's erase parameters, after which they are written with a standard "test pattern" (also generated by Pattern Generator 432) using the relevant candidate's write parameters. This test pattern, also typically supplied by the manufacturer of the flash memory chips for testing purposes, is designed to test bit states equally, taking adjacent cells into account. ECC data is also written with the test pattern, though Pathfinder 530 will make no attempt to recover the data. It is sufficient, in this embodiment, to detect the number of bit errors when reading the data, so as to determine whether each sector would have been recoverable with ECC error correction (e.g., no more than 40 bit errors in a sector written with 40-bit ECC).

For each candidate, an "erase time" (i.e., the amount of time required to erase the block) and a "program time" (i.e., the amount of time required to write the test pattern into the block) is extracted and stored by Data Collection module 434 for future use in generating candidate HW Scores (discussed below with reference to step 760). In one embodiment, multiple blocks are erased and written for a particular candidate, and the average erase time and program time is stored, while in other embodiments, all of the erase times and program times are stored for each candidate.

In step 735, Pathfinder 530 performs a "pre-retention read" (1 page at a time in this embodiment) of the test pattern from the relevant blocks corresponding to each tested candidate. In this embodiment, read parameter values provided by the manufacturer of the flash memory chips are utilized for this pre-retention read, as its purpose is to identify and filter out "very bad" candidates that are unable to recover data immediately after a write. No read retries are attempted in this embodiment.

ECC decoding is employed to identify the number of bit errors per sector. In one embodiment, if any sectors are unrecoverable, the candidate is deemed a "very bad" candidate and is excluded from further testing. In other embodiments, any candidate with an average number of errors per sector exceeding a predefined threshold is deemed a "bad candidate" and is excluded from further testing.

BER and read timing results are extracted and stored by Data Collection module 434 for subsequent use in generating candidate HW Scores (discussed below with reference to step 760). In one embodiment, BER information includes all raw data (e.g., the number of bit errors in each sector from each page read), while in other embodiments only summary information is stored (e.g., the number of sectors that were unrecoverable). Similarly, stored read timing results may in some embodiments include all raw data (such as the time required to complete the read of each sector, page, block, etc.), while in other embodiments only summary information is stored (e.g., the overall time to complete the read of the test pattern). In yet another embodiment, multiple identical reads are performed on the same page to take into account the effects of read disturb.

At this point, retention is simulated in step 740 using standard accelerated temperature-testing techniques—i.e., baking the flash memory in a temperature-controlled oven. For example, simulating 3 months of retention might require 2½ days at 160 degrees Fahrenheit. In any event, as noted above, the desired retention period is specified by Plotter 510 along with the candidates, and is determined by the company making SSD 100 (taking into consideration the retention period specified by the manufacturer of the Flash Memory Chips 110).

After the simulated retention period has elapsed, a post-retention read process is performed, in steps 750-753. Note that only write and erase parameters have been determined for each candidate up to this point, and that the pre-retention read performed for each candidate in step 735 was performed with read parameters provided by the manufacturer of the flash memory chips. The purpose of this post-retention read process, while not yet seeking to identify precise read parameter values for each candidate, is to determine the relative ability of each candidate to successfully recover data written to a block that endured the maximum number of P/E cycles (for the current health stage), and read after a predefined retention period.

In this embodiment, Pathfinder 530 initiates a "read sweep" process in step 750, in which Vt Window Generator 435 performs multiple reads (one page at a time) for each candidate (i.e., from the relevant blocks in which each candidate's test pattern was written, prior to the simulated retention period). Moreover, for each candidate, each read of a page will be performed multiple times using different read parameters. But note that each candidate will use the same read parameters for any given read of a page.

The purpose of this "read sweep" process is to identify, for each candidate, a voltage window (Vt window)—i.e., a range of voltages—in which the test pattern can be successfully recovered (i.e., no sectors having more than 40 bit errors). This range will likely differ for each candidate, because the test pattern was written with different write and erase parameters, despite the fact that each candidate will use the same read parameters for any given read. But, as discussed below, determining the appropriate read parameters to best distinguish candidates is complicated by the fact that the voltage boundaries distinguishing a "1" bit from a "0" bit tend to drift after a retention period (e.g., due to electrons leaking out of the floating gate).

It should be noted that each flash memory chip has multiple read parameters (10 in this embodiment), although we are only focused on a subset of these read parameters for this "read sweep" process—i.e., those read parameters relating to an "expected" threshold voltage (e.g., a voltage distinguishing a "1" bit from a "0" bit). Other read parameters (e.g., relating to read retries—"step voltage," "max retries," etc.) are not relevant to this process.

Moreover, for simplicity, this discussion will focus on SLC flash memory, which contains only 1 bit per transistor cell, and thus only one expected threshold voltage to distinguish the two states (e.g., 4.5V—where any voltage detected at or above 4.5V is deemed a "1" and any voltage below 4.5V is deemed a "0").

It is important to note, however, that odd and even pages of a block have different expected threshold voltages (doubling the number of these parameters), and that MLC (2 bits per cell) and TLC (3 bits per cell) technologies have multiples of these expected threshold voltages (e.g., MLC requires 3 expected threshold voltages to distinguish 4 states, while TLC requires 7 expected threshold voltages to distinguish 8 states), even apart from the odd/even page issue. Nevertheless, upon understanding how the read sweep process applies to a simple SLC scenario, it will be apparent to one skilled in the art how to apply this same process to these more complex scenarios in which multiple read parameters represent multiple different expected threshold voltages (i.e., generating more permutations for the read sweep process).

So, for simplicity, assume that a flash chip manufacturer specifies a single expected threshold voltage (e.g., 4.5V, represented as an operating parameter value between 0-255—say 130). This value of 130 would be used as a starting read parameter in step 750.

But, as noted above, retention may affect these boundaries. In other words, after retention, 4.7V (say a value of 135) may be the appropriate boundary distinguishing a "1" from a "0." Attempts to use an operating parameter value of 130 may therefore yield many bit errors, possibly resulting in an unrecoverable sector. So, this read sweep process is designed to identify the range of expected threshold voltages (or corresponding read parameter values) in which a candidate can successfully read a page of the test pattern (and, ultimately, all pages within a block).

For example, after retention, a candidate using a read parameter value of 130 to read a page of the test pattern might successfully recover all sectors of that page. But, trying values above 130 (e.g., 131, 132, etc.) might eventually (say at 135) yield one or more unrecoverable sectors. Similarly, trying values below 130 might eventually (say at 127) yield one or more unrecoverable sectors. In that case, the candidate's Vt window (for this 1 page) would be 128-134 (or a range of 7). This is the result of the read sweep process in step 751—but only for 1 page of that candidate. Of course, this same read sweep process is applied to all candidates in parallel.

Now, still in step 751, this same read sweep process is applied to all pages of each relevant block (e.g., 128 read sweeps if there are 128 pages in a block). At this point, each candidate has 128 associated "Vt page windows." In step 752, these 128 Vt page windows for each candidate are "overlapped" to determine the smallest contiguous Vt window (if any) in which all values intersect at least one of the Vt page windows. If this is not the case, then that candidate has failed the Vt window process (for this current test) and is given a Vt window score of 0. Otherwise, it is given a Vt window score equal to the size of its range (e.g., 4 if its Vt window ranges from 130-133).

If multiple tests are performed by Pathfinder 530, then the smallest ("worst") Vt window score is determined, in step 753, along with a percentage of tests for which a successful Vt window was identified (e.g., 4, 0.9—reflecting the smallest Vt window score of 4, and the fact that a successful Vt window was identified in 9 of 10 tests).

In step 760, the final HW Scores for each candidate are determined. Note that, if multiple tests are performed, these HW Scores will be determined after each test. In this embodiment, the HW Score for each candidate includes 3 components. The first two components are the "program time" and "erase time" determined in step 730, along with an indication of whether these times satisfied the given constraints (e.g., 1.8, 1) for a passing program time given a 2 ms max constraint, and (2.2, 0) for a failing program time. If multiple tests are performed, multiple program and erase time components are included in the HW Score. The third component is the Vt window score, which itself consists of two components—the first being the smallest Vt window score (at the block level, across all pages), and the second being the percentage of tests for which a successful Vt window was identified. In another embodiment, the Vt window score for all tests is included in the HW Score.

Note that Plotter 510, in this embodiment, does not utilize the raw data for BER (errors/sector) or for Vt window (actual V range per test or per page), instead relying solely on the program and erase times for each test (each with a pass/fail bit), and the Vt window summary score (i.e., size of smallest voltage range which was able to successfully recover data, along with the percentage of tests passed). This information is sufficient for Plotter 510 to update/rebuild its 3 models, whereas the precise read parameters (i.e., waypoints) are not determined for any given health stage until the number of candidates is narrowed to a small number (e.g., 5 in one embodiment). Nevertheless, in one embodiment, summary BER data (a single number) is returned for each candidate, reflecting a total BER averaged across the relevant blocks and across all tests performed.

Pathfinder 530 determines, in step 765, whether the current health stage is down to the "final 5" candidates. If not, the HW Scores are returned to Plotter 510 in step 790, and this iteration of the process ends. As noted above, if multiple tests are to be performed, this post-retention process is repeated starting with step 750.

But, if down to the "final 5" candidates, then waypoints are generated for all 5 final candidates in step 770. In this embodiment, no additional reads are necessary, as Pathfinder 530 still has all of the data generated from the post-retention read process in steps 750-753. In other words, for each candidate, it has Vt windows for every test performed (e.g., hundreds of tests in this final stage).

In early health stages, it is not unusual for an overlapping Vt window to be identified across all tests. If one exists, the midpoint of that Vt window is deemed the first waypoint, and the remaining waypoints, in order, alternate around either side of that waypoint. For example, if the final Vt window (overlapping for all tests) is 138-158, then the waypoints would be (148, 149, 147, 150, 146, etc.).

If no single overlapping Vt window exists (as is often the case in later health stages), then the Vt window that captures the largest percentage of the pages is identified (e.g., 90% of all pages, but with gaps that miss the other 10%). The midpoint of that Vt window is deemed the first waypoint. However, the process is then repeated for the missing pages that were not captured by the first Vt window. The midpoint of the Vt window that captures the largest percentage of those missing pages is deemed the second waypoint (and so on, until all pages have been accounted for). In other embodiments, a myriad of techniques can be employed to determine and order additional waypoints, based on the raw Vt window data and the central objective—i.e., to identify and order the waypoints based upon the extent to which they successfully recover the test pattern data. In one embodiment, waypoints are determined for different retention periods, enabling Navigator 200, to employ knowledge of current retention times to select waypoints based upon their "pre-tested" success for that (or the closest) corresponding retention period.

In any event, now that each of the 5 final candidates also has a set of waypoints (e.g., 8 waypoints in the current embodiment), a final hardware test is performed in step 770 on these 5 candidates to determine the "optimal" candidate for the current health stage. In one embodiment, the waypoints are used (in order) during this final test to recover the test pattern (i.e., a read retry). The candidate is scored based upon its use of the fewest waypoints. If any sectors are unrecoverable after using all of its waypoints, it is disqualified in this embodiment.

In any event, the HW Scores (and waypoints) for all 5 final candidates are returned to Plotter 510 in step 790, and the process ends. As noted above, Health Stage Analyzer 419 will compare these HW Scores and determine the "optimal" candidate for the current health stage, and then proceed to the next health stage (if one is warranted). In the highly unlikely event that all candidates are disqualified, another iteration with Pathfinder 530 is performed.

V. Extending Operational Lifetime of SSD

As discussed above, the principles of the present invention provide significant advantages over systems that employ a single fixed set of operating parameters, as well as those that modify operating parameters based solely upon the cumulative number of elapsed P/E cycles (age). These advantages are illustrated in graph 800 of FIG. 8.

For example, x-axis 810 of graph 800 measures P/E cycles in units that are multiples of the default total expected lifetime specified by the manufacturer of the Flash Memory Chips 110 in SSD 100, while y-axis 820 measures stress as a percentage of the fixed operating parameters employed by the manufacturer of the Flash Memory Chips 110 in SSD 100. Thus, horizontal line 835 represents the result of strategy 830—i.e., employing fixed operating parameters. The stress levels remain constant for the lifetime of SSD 100, which correlates to the expected number of P/E cycles specified by the manufacturer of the Flash Memory Chips 110.

Turning to strategy 840 (varying operating parameters solely based on a cumulative P/E cycle count), stairstep lines 845 represent an extension of the operational lifetime of SSD 100 (e.g., almost 3× compared to the manufacturer's expected lifetime) due to the fact that stress levels begin lower during earlier stages, and gradually rise toward the manufacturer's "worst-case" scenario as cumulative P/E cycles increase. But, note, however, that stages are relatively short in duration, primarily due to the fact that strategy 840 is incapable of distinguishing outlier blocks ("bad blocks") from retention problems ("bad data"), and therefore cannot extend stages to their fullest potential. Moreover, the stages are relatively short to begin with because this same defect exists during offline characterization, in which errors must be presumed to be due to cumulative wear, when they may in fact be due to outlier blocks, retention issues and other factors beyond mere P/E cycles. As a result, a "worst-case" scenario must be presumed during offline characterization. For example, if offline testing revealed an unacceptable number of errors after 1500-2000 P/E cycles, the stage must be limited to 1500 P/E cycles in order to ensure "pre-tested" retention.

Finally, by employing strategy 850—i.e., the concepts of the present invention, in which health (not merely cumulative P/E cycles) of the flash memory is monitored both during the offline characterization phase, and during the operational lifetime of SSD 100, stairstep lines 855 illustrate a significantly extended operational lifetime (e.g., almost 10× compared to the manufacturer's expected lifetime). As a result of this strategy 850, more health stages are possible, starting at lower levels of stress and extending much longer than for the other strategies (i.e., for more P/E cycles).

As discussed above, there are many reasons for this dramatic improvement. By accurately recognizing the actual health of the flash memory during early health stages of life (and not being misled by outlier blocks and unexpected usage of SSD 100), relatively lower stress can be employed during these early health stages, which slows the rate of inevitable wear. Moreover, even as cumulative wear begins to occur, health stages can be extended for additional P/E cycles because outlier blocks and unexpected usage can be detected and addressed by taking preventive measures, such as reducing the usage of such blocks, or resting them temporarily, as well as moving data to manage retention issues and avoid unnecessary read retries and read failures.

Finally, it should be noted that stress levels in later health stages can be extended even beyond the "worst-case" scenarios contemplated by the manufacturer of Flash Memory Chips 110, because actual cumulative wear has been abated over time, enabling the flash memory to reach its full potential, as determined and "pre-tested" during an offline characterization phase. Moreover, by avoiding unnecessarily stringent retention requirements (e.g., 1-year, as opposed to 3 months), strategy 850 can extend this potential even further.

VI. Miscellaneous Alternative Embodiments

A. Timing Signatures

As noted above, due to manufacturing variations, certain areas of flash memory (e.g., outlier blocks) wear faster than others. In one embodiment, offline machine-learning techniques are employed to determine "timing signatures" of various different categories of blocks, reflecting how quickly those blocks wear over time (ultimately reflecting how many total P/E cycles they will last).

These timing signatures are determined offline by monitoring write and erase timing and BER data at various different points in the life of the flash memory being tested on actual flash memory chips. Machine-learning techniques are employed to feed this training data into software models designed to predict a "rate of change" for numerous different categories of blocks (e.g., 50 different categories of blocks, each exhibiting different "timing signatures" reflecting their expected lifetime in total P/E cycles).

During the operational lifetime of SSD 100, Navigator 200 issues artificial write and erase commands to various blocks of flash memory to capture (e.g., via soft and critical thresholds) a rate of change in those write and erase times that matches the timing signature of its predefined 50 categories of blocks. Upon correlating particular blocks with one of these categories, Navigator 200 can infer its expected lifetime (i.e., how many P/E cycles it has left before it wears out), and adjust its usage accordingly. For example, blocks exhibiting the "shortest lifespan" timing signatures are rested or relegated to low-priority usage, and eventually placed on a permanent bad block list. Blocks exhibiting the "longest lifespan" timing signatures are used more frequently—e.g., by artificially decreasing their P/E cycle counts so that STD Flash Controller Firmware 122 will be more likely to utilize them. In one embodiment, different sets of operating parameters could be employed for different categories of blocks.

B. Host-side Monitoring

In one embodiment, a host system is aware of particular types of files (e.g., bitmapped images, movies, etc.) that can tolerate more errors from a user's perspective. By identifying those file categories to SSD 100 (e.g., during write operations), Flash Controller 120 can store those files in "weaker" areas of flash memory. For example, it is well known that the last page of a block is more prone to read errors. Moreover, upon detecting errors during read operations on those blocks, Flash Controller 120 can perform fewer (or no) read retries, given that performance may be deemed more important than accuracy in light of the fact that such files can tolerate more errors.

C. Adaptive ECC

As noted above, it is well known that pages closer to the end of a block are gradually more prone to read errors. In one embodiment, Flash Controller 120 maintains an "KC page table" correlating each page in a block to an ECC level, with those pages toward the end of a block having a relatively higher ECC level (e.g., 40-bit ECC) than those toward the beginning of the block (e.g., 10-bit ECC). Because Flash Controller 120 is aware of the page it is writing, it can apply that particular corresponding ECC level to that page—padding the write with additional "1" bits, for example, to maintain a fixed data length, whether applying 10-bit ECC or 40-bit ECC, or a level in between. The same ECC page table is employed when reading the data to ensure the appropriate ECC decoding level is employed. In another embodiment, ECC levels can be varied based on a block's predetermined timing signature—e.g., assigning fewer ECC bits to blocks having "better" timing signatures.

Because ECC decoding is faster with lower ECC levels, performance will be improved overall, enabling the use of simpler ECC decoding schemes (e.g., BCH, as opposed to more time-consuming LDPC and other variable-speed decoding schemes). And, by limiting lower-level ECC to those pages that are less susceptible to errors, the tradeoff of risking more read failures is mitigated.

Moreover, in one embodiment, each block has an associated ECC page table, and Navigator 200 modifies the relative ECC values based upon its monitoring of the health of the flash memory (leaving the relative values intact—i.e., pages toward the end of the block still having relatively higher ECC levels). When ECC page table entries are changed for a particular block, Flash Controller 120 will wait until the block is written again before employing the new entry.

In one embodiment, if blocks are relatively more healthy, the ECC levels for those blocks are decreased, while the ECC levels for less healthy blocks are increased. Moreover, ECC levels may be combined with other factors as well—e.g., permitting less aggressive write parameters. It will be apparent to one skilled in the art that various other actions can be implemented based upon the knowledge of the relative health of a block and the differing ECC levels currently applied to particular pages within that block.

The invention claimed is:

1. A flash memory controller that controls the operation of one or more flash memory chips, each chip organized into one or more LUNs, and each LUN associated with one or more blocks of flash memory and one or more control registers storing operating parameters associated with that LUN, the flash memory controller comprising:
   (a) an operating parameter database that stores, with respect to each LUN of the one or more flash memory chips, a plurality of sets of operating parameters, each set of operating parameters corresponding to a health stage representing an estimated level of degradation of the flash memory within that LUN;
   (b) a controller memory command module that issues read, write and erase controller memory commands to the flash memory chips, wherein each of the flash memory chips implements the controller memory commands by applying varying levels of electrical stimuli to the blocks of flash memory in a LUN in accordance with current values of the operating parameters associated with that LUN; and
   (c) an inference engine that:
      (i) analyzes a plurality of wear indicators that evidence degradation of the flash memory over time, wherein one of the plurality of wear indicators is a current cumulative number of program/erase cycles performed by the flash memory controller during the operational lifetime of the one or more flash memory chips, and
      (ii) determines, based on the analysis of the wear indicators, whether a transition of a LUN from a current health stage to a subsequent health stage is warranted and, if so, replaces the contents of the LUN's control registers with the set of operating parameters corresponding to the subsequent health stage.

2. The flash memory controller of claim 1, wherein the plurality of wear indicators includes BER data resulting from the issuance of memory controller commands to read the contents of the flash memory.

3. The flash memory controller of claim 1, wherein the plurality of wear indicators includes timing information with respect to the issuance of one or more controller memory commands.

4. The flash memory controller of claim 1, wherein, with respect to each health stage, the set of operating parameters corresponding to that health stage is the same for each LUN of each of the one or more flash memory chips.

5. The flash memory controller of claim 1, wherein the sets of operating parameters corresponding to the health stages are predetermined in an offline characterization phase prior to the operational lifetime of the one or more flash memory chips.

6. The flash memory controller of claim 1, wherein the inference engine, upon determining that a transition of a LUN from a current health stage to a subsequent health stage is not warranted, employs one or more preventive measures to reduce the rate of degradation of the flash memory over time, and thereby extend the operational lifetime of the one or more flash memory chips.

7. The flash memory controller of claim 6, wherein the preventive measures include one or more of the following: (a) resting one or more of the blocks of a LUN of the one or more flash memory chips, (b) reducing the usage of one or more blocks of a LUN of the one or more flash memory chips, and (c) moving the data contents of a suspect block to another block in the one or more flash memory chips.

8. A method for controlling the operation of one or more flash memory chips, each chip organized into one or more LUNs, and each LUN associated with one or more blocks of flash memory and one or more control registers storing operating parameters associated with that LUN, the method comprising the following steps:
   (a) storing, with respect to each LUN of the one or more flash memory chips, a plurality of sets of operating parameters, each set of operating parameters corresponding to a health stage representing an estimated level of degradation of the flash memory within that LUN;
   (b) issuing read, write and erase controller memory commands to the flash memory chips, wherein each of the flash memory chips implements the controller memory commands by applying varying levels of electrical stimuli to the blocks of flash memory in a LUN in accordance with current values of the operating parameters associated with that LUN;
   (c) analyzing a plurality of wear indicators that evidence degradation of the flash memory over time, wherein one of the plurality of wear indicators is a current cumulative number of program/erase cycles performed during the operational lifetime of the one or more flash memory chips; and
   (d) determining, based on the analysis of the wear indicators, whether a transition of a LUN from a current health stage to a subsequent health stage is warranted and, if so, replacing the contents of the LUN's control registers with the set of operating parameters corresponding to the subsequent health stage.

9. The method of claim 8, wherein the plurality of wear indicators includes BER data resulting from the issuance of memory controller commands to read the contents of the flash memory.

10. The method of claim 8, wherein the plurality of wear indicators includes timing information with respect to the issuance of one or more controller memory commands.

11. The method of claim 8, wherein, with respect to each health stage, the set of operating parameters corresponding to that health stage is the same for each LUN of each of the one or more flash memory chips.

12. The method of claim 8, wherein the sets of operating parameters corresponding to the health stages are predetermined in an offline characterization phase prior to the operational lifetime of the one or more flash memory chips.

13. The method of claim 8, further including the step, upon determining that a transition of a LUN from a current health stage to a subsequent health stage is not warranted, of employing one or more preventive measures to reduce the rate of degradation of the flash memory over time, and thereby extend the operational lifetime of the one or more flash memory chips.

14. The method of claim 13, wherein the preventive measures include one or more of the following: (a) resting one or more of the blocks of a LUN of the one or more flash memory chips, (b) reducing the usage of one or more blocks of a LUN of the one or more flash memory chips, and (c) moving the data contents of a suspect block to another block in the one or more flash memory chips.

* * * * *